United States Patent
Uematsu et al.

(10) Patent No.: US 9,569,144 B2
(45) Date of Patent: Feb. 14, 2017

(54) DRAM WITH SDRAM INTERFACE, AND HYBRID FLASH MEMORY MODULE

(71) Applicant: Hitachi, Ltd., Chiyoda-ku, Tokyo (JP)

(72) Inventors: Yutaka Uematsu, Tokyo (JP); Satoshi Muraoka, Tokyo (JP); Hideki Osaka, Tokyo (JP); Masabumi Shibata, Tokyo (JP); Yuusuke Fukumura, Tokyo (JP); Satoru Watanabe, Tokyo (JP); Hiroshi Kakita, Tokyo (JP); Akio Idei, Tokyo (JP); Hitoshi Ueno, Tokyo (JP); Takayuki Ono, Tokyo (JP); Takashi Miyagawa, Tokyo (JP); Michinori Naito, Tokyo (JP); Taishi Sumikura, Tokyo (JP); Yuichi Fukuda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 31 days.

(21) Appl. No.: 14/763,019

(22) PCT Filed: Mar. 27, 2013

(86) PCT No.: PCT/JP2013/059155
§ 371 (c)(1),
(2) Date: Jul. 23, 2015

(87) PCT Pub. No.: WO2014/155593
PCT Pub. Date: Feb. 10, 2014

(65) Prior Publication Data
US 2015/0355846 A1    Dec. 10, 2015

(51) Int. Cl.
*G11C 14/00* (2006.01)
*G06F 3/06* (2006.01)
(Continued)

(52) U.S. Cl.
CPC .............. *G06F 3/068* (2013.01); *G06F 3/0611* (2013.01); *G06F 3/0629* (2013.01);
(Continued)

(58) Field of Classification Search
CPC ................ G11C 5/06; G11C 5/02; G11C 8/06
See application file for complete search history.

(56) References Cited

U.S. PATENT DOCUMENTS 6,928,512 B2 *  8/2005  Ayukawa .............. G11C 11/005
                                                      365/222
7,296,754 B2 * 11/2007  Nishizawa ........... G06K 19/072
                                                      235/492

(Continued)

FOREIGN PATENT DOCUMENTS

JP    2002-366429 A    12/2002
JP    2009-526323 A     7/2009
(Continued)

OTHER PUBLICATIONS

International Search Report (PCT/ISA/210) dated Jun. 18, 2013 with English translation (five pages).

*Primary Examiner* — Tuan T Nguyen
(74) *Attorney, Agent, or Firm* — Crowell & Moring LLP

(57) ABSTRACT

When DRAMs that are high-speed memories and flash memories that are lower in speed but can be larger in capacity than the DRAM are to be mounted on a DIMM, what matters in maximizing CPU memory bus throughput is the arrangement of the mounted components. The present disclosure provides a memory module (DIMM) that includes memory controllers arranged on the module surface closer to a socket terminal and DRAMs serving as high-speed memories arranged on the back surface. Nonvolatile memories as large-capacity memories are arranged on the side farther from the socket terminal.

15 Claims, 21 Drawing Sheets

(51) Int. Cl.
*G11C 5/04* (2006.01)
*G06F 13/16* (2006.01)
*G11C 7/10* (2006.01)

(52) U.S. Cl.
CPC ............ *G06F 13/1694* (2013.01); *G11C 5/04* (2013.01); *G11C 7/10* (2013.01)

(56) References Cited

U.S. PATENT DOCUMENTS

| | | |
|---|---|---|
| 2002/0185337 A1 | 12/2002 | Miura et al. |
| 2007/0195613 A1 | 8/2007 | Rajan et al. |
| 2007/0288683 A1 | 12/2007 | Panabaker et al. |
| 2010/0095048 A1 | 4/2010 | Bechtolsheim et al. |
| 2010/0115191 A1 | 5/2010 | Hampel et al. |
| 2010/0142243 A1 | 6/2010 | Baxter |
| 2010/0238696 A1* | 9/2010 | Baek ................. H01L 24/48 365/51 |

FOREIGN PATENT DOCUMENTS

| | | |
|---|---|---|
| JP | 2009-540431 A | 11/2009 |
| JP | 2010-524059 A | 7/2010 |

\* cited by examiner

FIG. 3A
(a)
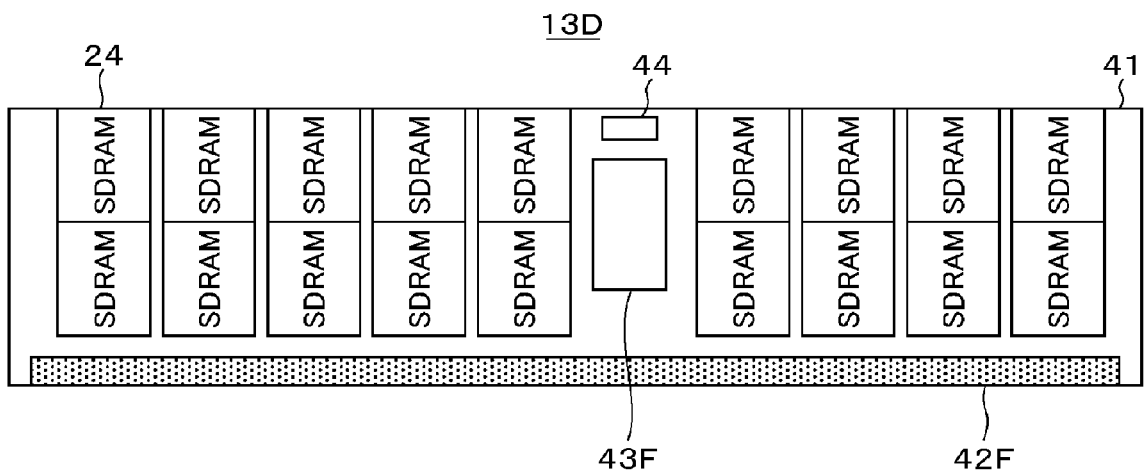
(b)
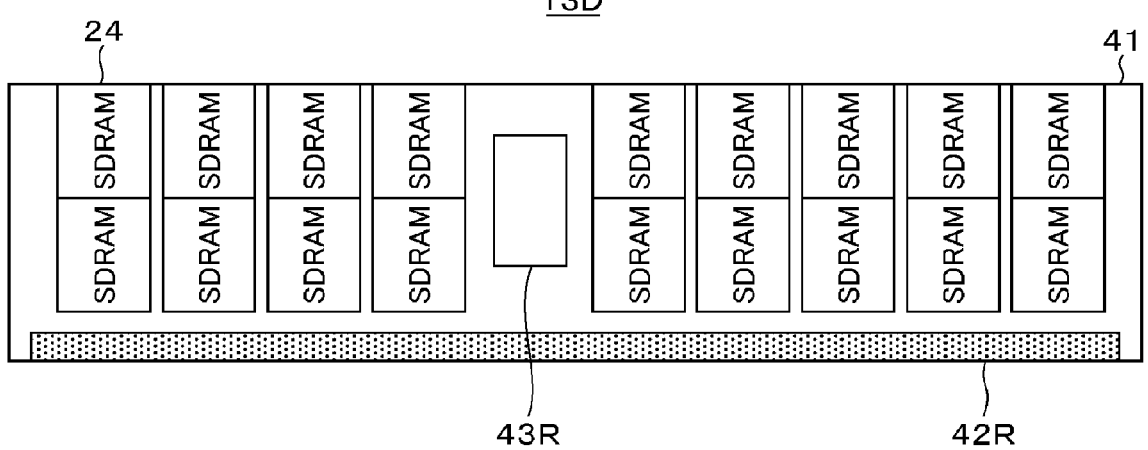

FIG. 3B

| TERMINAL | SYMBOL | TERMINAL | SYMBOL | TERMINAL | SYMBOL | TERMINAL | SYMBOL |
|---|---|---|---|---|---|---|---|
| 1 | VREFDQ | 31 | DQ25 | 61 | A2 | 91 | DQ41 |
| 2 | VSS | 32 | VSS | 62 | VDD | 92 | VSS |
| 3 | DQ0 | 33 | DQS3# | 63 | NF | 93 | DQS5# |
| 4 | DQ1 | 34 | DQS3 | 64 | NF | 94 | DQS5 |
| 5 | VSS | 35 | VSS | 65 | VDD | 95 | VSS |
| 6 | DQS0# | 36 | DQ26 | 66 | VDD | 96 | DQ42 |
| 7 | DQS0 | 37 | DQ27 | 67 | VREFCA | 97 | DQ43 |
| 8 | VSS | 38 | VSS | 68 | Par_IN | 98 | VSS |
| 9 | DQ2 | 39 | CB0 | 69 | VDD | 99 | DQ48 |
| 10 | DQ3 | 40 | CB1 | 70 | A10 | 100 | DQ49 |
| 11 | VSS | 41 | VSS | 71 | BA0 | 101 | VSS |
| 12 | DQ8 | 42 | DQS8# | 72 | VDD | 102 | DQS6# |
| 13 | DQ9 | 43 | DQS8 | 73 | WE# | 103 | DQS6 |
| 14 | VSS | 44 | VSS | 74 | CAS# | 104 | VSS |
| 15 | DQS1# | 45 | CB2 | 75 | VDD | 105 | DQ50 |
| 16 | DQS1 | 46 | CB3 | 76 | S1# | 106 | DQ51 |
| 17 | VSS | 47 | VSS | 77 | ODT1 | 107 | VSS |
| 18 | DQ10 | 48 | VTT | 78 | VDD | 108 | DQ56 |
| 19 | DQ11 | 49 | VTT | 79 | S2# | 109 | DQ57 |
| 20 | VSS | 50 | CKE0 | 80 | VSS | 110 | VSS |
| 21 | DQ16 | 51 | VDD | 81 | DQ32 | 111 | DQS7# |
| 22 | DQ17 | 52 | BA2 | 82 | DQ33 | 112 | DQS7 |
| 23 | VSS | 53 | Err_Out# | 83 | VSS | 113 | VSS |
| 24 | DQS2# | 54 | VDD | 84 | DQS4# | 114 | DQ58 |
| 25 | DQS2 | 55 | A11 | 85 | DQS4 | 115 | DQ59 |
| 26 | VSS | 56 | A7 | 86 | VSS | 116 | VSS |
| 27 | DQ18 | 57 | VDD | 87 | DQ34 | 117 | SA0 |
| 28 | DQ19 | 58 | A5 | 88 | DQ35 | 118 | SCL |
| 29 | VSS | 59 | A4 | 89 | VSS | 119 | SA2 |
| 30 | DQ24 | 60 | VDD | 90 | DQ40 | 120 | VTT |

F I G. 3C

| TERMINAL | SYMBOL | TERMINAL | SYMBOL | TERMINAL | SYMBOL | TERMINAL | SYMBOL |
|---|---|---|---|---|---|---|---|
| 121 | VSS | 151 | VSS | 181 | A1 | 211 | VSS |
| 122 | DQ4 | 152 | DQS12 | 182 | VDD | 212 | DQS14 |
| 123 | DQ5 | 153 | DQS12# | 183 | VDD | 213 | DQS14# |
| 124 | VSS | 154 | VSS | 184 | CK0 | 214 | VSS |
| 125 | DQS9 | 155 | DQ30 | 185 | CK0# | 215 | DQ46 |
| 126 | DQS9# | 156 | DQ31 | 186 | VDD | 216 | DQ47 |
| 127 | VSS | 157 | VSS | 187 | EVENT# | 217 | VSS |
| 128 | DQ6 | 158 | CB4 | 188 | A0 | 218 | DQ52 |
| 129 | DQ7 | 159 | CB5 | 189 | VDD | 219 | DQ53 |
| 130 | VSS | 160 | VSS | 190 | BA1 | 220 | VSS |
| 131 | DQ12 | 161 | DQS17 | 191 | VDD | 221 | DQS15 |
| 132 | DQ13 | 162 | DQS17# | 192 | RAS# | 222 | DQS15# |
| 133 | VSS | 163 | VSS | 193 | S0# | 223 | VSS |
| 134 | DQS10 | 164 | CB6 | 194 | VDD | 224 | DQ54 |
| 135 | DQS10# | 165 | CB7 | 195 | ODT0 | 225 | DQ55 |
| 136 | VSS | 166 | VSS | 196 | A13 | 226 | VSS |
| 137 | DQ14 | 167 | NC | 197 | VDD | 227 | DQ60 |
| 138 | DQ15 | 168 | RESET# | 198 | S3# | 228 | DQ61 |
| 139 | VSS | 169 | CKE1 | 199 | VSS | 229 | VSS |
| 140 | DQ20 | 170 | VDD | 200 | DQ36 | 230 | DQS16 |
| 141 | DQ21 | 171 | A15 | 201 | DQ37 | 231 | DQS16# |
| 142 | VSS | 172 | A14 | 202 | VSS | 232 | VSS |
| 143 | DQS11 | 173 | VDD | 203 | DQS13 | 233 | DQ62 |
| 144 | DQS11# | 174 | A12 | 204 | DQS13# | 234 | DQS63 |
| 145 | VSS | 175 | A9 | 205 | VSS | 235 | VSS |
| 146 | DQ22 | 176 | VDD | 206 | DQ38 | 236 | VDDSPD |
| 147 | DQ23 | 177 | A8 | 207 | DQ39 | 237 | SA1 |
| 148 | VSS | 178 | A6 | 208 | VSS | 238 | SDA |
| 149 | DQ28 | 179 | VDD | 209 | DQ44 | 239 | VSS |
| 150 | DQ29 | 180 | A3 | 210 | DQ45 | 240 | VTT |

F I G. 3D

| SYMBOL | FUNCTION | TYPE |
|---|---|---|
| Ax | Address Inputs | INPUT |
| BAx | Bank Address Inputs | INPUT |
| CKx, CKx# | Clock | INPUT |
| CKEx | Clock Enable | INPUT |
| DMx | Data Mask | INPUT |
| ODTx | On Die Termination | INPUT |
| Par_In | Party Input | INPUT |
| RAS#, CAS#, WE# | Command Inputs | INPUT |
| RESET# | Active Low Asynchronous Reset | INPUT |
| Sx# | Chip select | INPUT |
| SAx | Serial Address Inputs | INPUT |
| SCL | Serial Clock for temperature sensor/SPD EEPROM | INPUT |
| CBx | Check Bits | INPUT/OUTPUT |
| DQx | Data Input/Output | INPUT/OUTPUT |
| DQSx, DQSx# | Data Strobe | INPUT/OUTPUT |
| SDA | Serial Data | INPUT/OUTPUT |
| TDQSx, TDQSx# | Redundant Data Strobe | OUTPUT |
| Err_OUT# | Parity Error Output | OUTPUT |
| EVENT# | Temperature Event | OUTPUT |
| VDD | Power Supply | VOLTAGE SUPPLY |
| VDDSPD | Temperature Sensor/SPD EEPROM Power Supply | VOLTAGE SUPPLY |
| VREFCA | Reference voltage for CA | VOLTAGE SUPPLY |
| VREFDQ | Reference voltage for DQ | VOLTAGE SUPPLY |
| VSS | Ground | VOLTAGE SUPPLY |
| VTT | Temperature Voltage | VOLTAGE SUPPLY |
| NC | No Connect | – |
| NF | No Function | – |

F I G. 4A
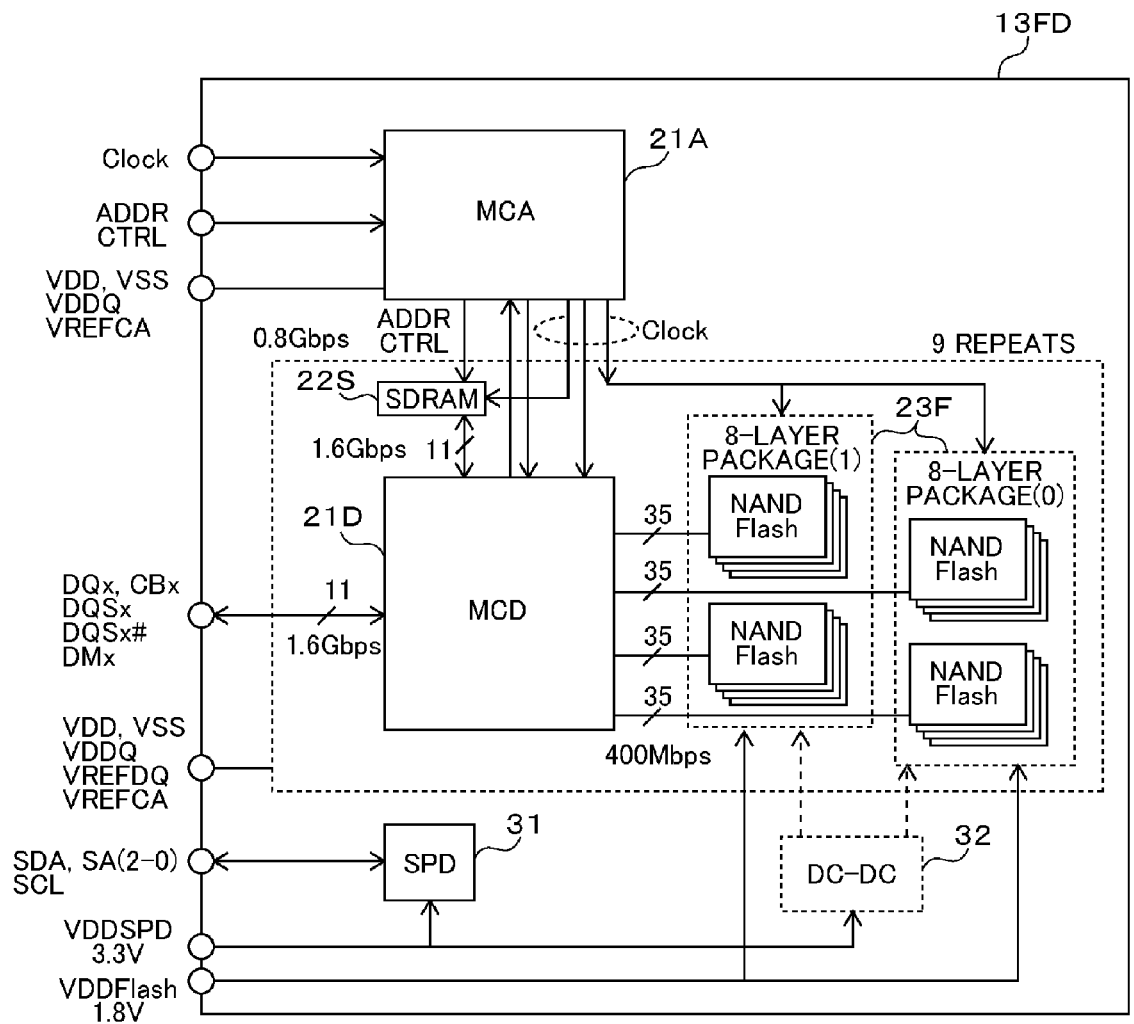

F I G. 4D
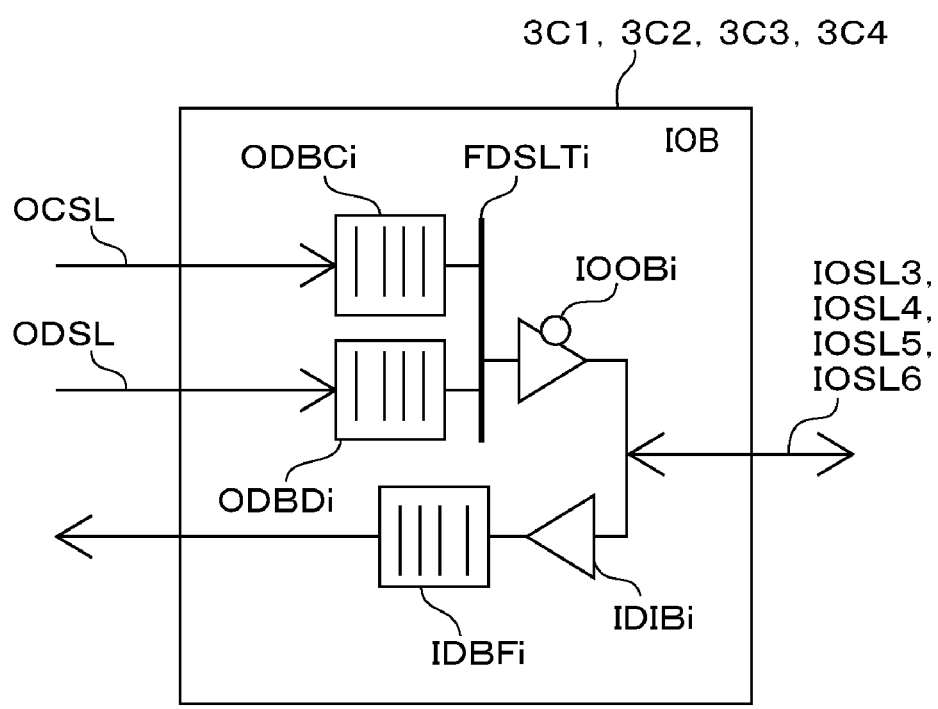

F I G. 5
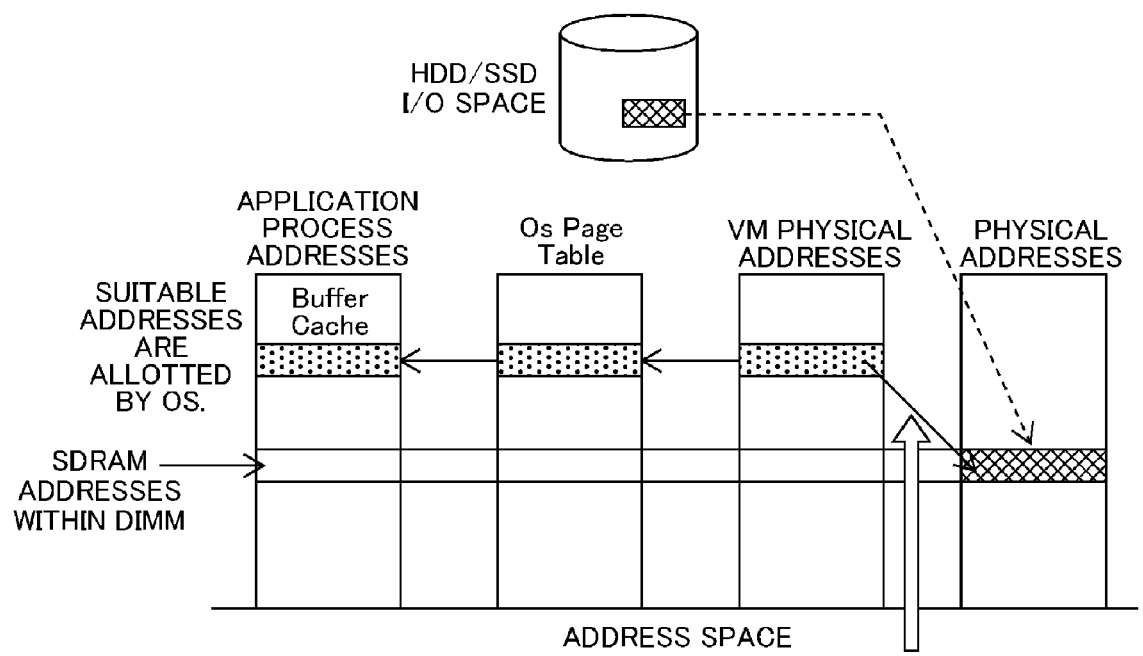

FIG. 8A

|   | 1 | 2 | 3 | 4 | 5 | 6 | 7 | 8 | 9 |
|---|---|---|---|---|---|---|---|---|---|
| A | $V_{SS}$ | $V_{DD}$ | NC | | | | NF/TDQS# | $V_{SS}$ | $V_{DD}$ |
| B | $V_{SS}$ | $V_{SSQ}$ | DQ0 | | | | DM/TDQS | $V_{SSQ}$ | $V_{DDQ}$ |
| C | $V_{DDQ}$ | DQ2 | DQ5 | | | | DQ1 | DQ3 | $V_{SSQ}$ |
| D | $V_{SSQ}$ | DQ6 | DQS# | | | | $V_{DD}$ | $V_{SS}$ | $V_{SSQ}$ |
| E | $V_{REFDQ}$ | $V_{DDQ}$ | DQ4 | | | | DQ7 | DQ5 | $V_{DDQ}$ |
| F | ODT1 | $V_{SS}$ | RAS# | | | | CK | $V_{SS}$ | CKE1 |
| G | ODT0 | $V_{DD}$ | CAS# | | | | CK# | $V_{DD}$ | CKE0 |
| H | CS1# | CS0# | WE# | | | | A10/AP | ZQ0 | ZQ1 |
| J | $V_{SS}$ | BA0 | BA2 | | | | A15 | $V_{REFCA}$ | $V_{SS}$ |
| K | $V_{DD}$ | A3 | A0 | | | | A12/BC# | BA1 | $V_{DD}$ |
| L | $V_{SS}$ | A5 | A2 | | | | A1 | A4 | $V_{SS}$ |
| M | $V_{DD}$ | A7 | A9 | | | | A11 | A6 | $V_{DD}$ |
| N | $V_{SS}$ | RESET# | A13 | | | | A14 | A8 | $V_{SS}$ |

FIG. 8B

| SYMBOL | FUNCTION | TYPE | CONNECTED CNT |
|---|---|---|---|
| CK, CK# | Clock | INPUT | MCA |
| CKE | Clock Enable | INPUT | MCA |
| CS# | Chip Select | INPUT | MCA |
| RAS#, CAS#, WE# | Command Inputs | INPUT | MCA |
| BA[2:0] | Bank Address Inputs | INPUT | MCA |
| A10(AP) | Auto-Precharge | INPUT | MCA |
| A[15:0] | Address Inputs | INPUT | MCA |
| A12(/BC) | Burst Chop | INPUT | MCA |
| ODT | On Die Termination | INPUT | MCA |
| RESET# | Active Low Asynchronous Reset | INPUT | MCA |
| DQ[7:0] | Data Input/ Output | INPUT/OUTPUT | MCD |
| DQS, DQS# | Data Strobe | INPUT/OUTPUT | MCD |
| DM | Input Data Mask | INPUT | MCD |
| TDQS, TDQS# | Termination Data Strobe | OUTPUT | MCD |
| NC | No Connect | – | – |
| NF | No Function | – | – |
| VDDQ | DQ Power Supply | VOLTAGE SUPPLY | – |
| VDD | Power Supply | VOLTAGE SUPPLY | – |
| VSSQ | DQ Ground | VOLTAGE SUPPLY | – |
| VSS | Ground | VOLTAGE SUPPLY | – |
| VREFCA | Reference voltage for CA | VOLTAGE SUPPLY | – |
| VREFDQ | Reference voltage for DQ | VOLTAGE SUPPLY | – |
| ZQ | Reference pin for ZQ calibration | VOLTAGE SUPPLY | – |

FIG. 9

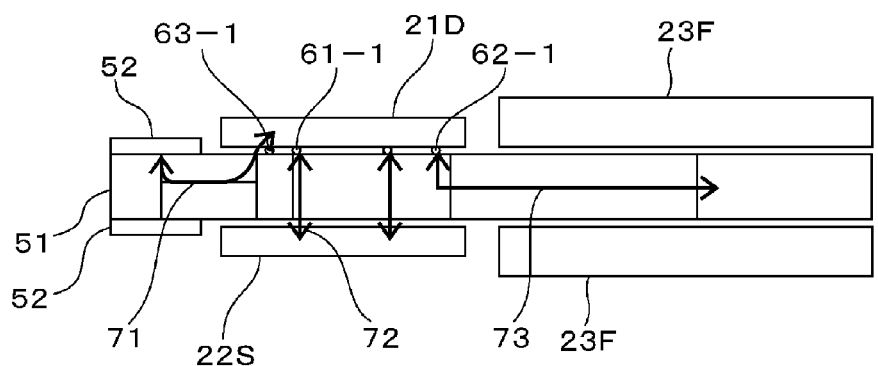

FIG. 10
(a)
50A
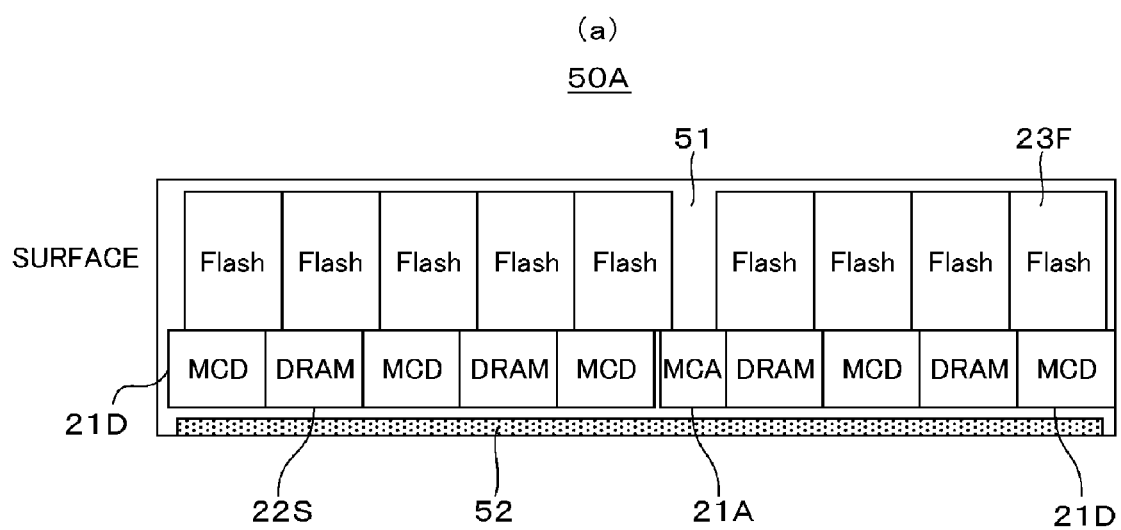
(b)
50A
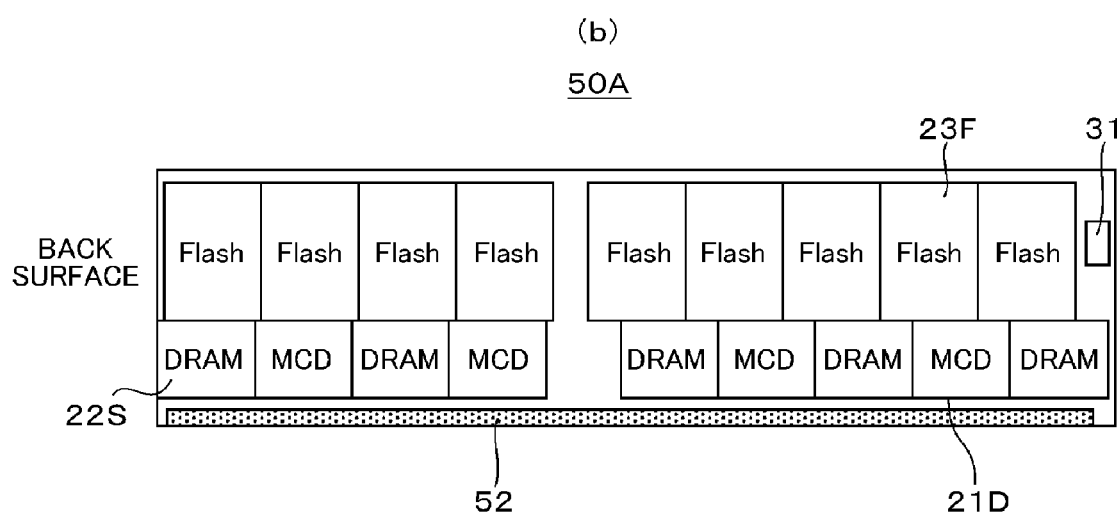

F I G. 1 2
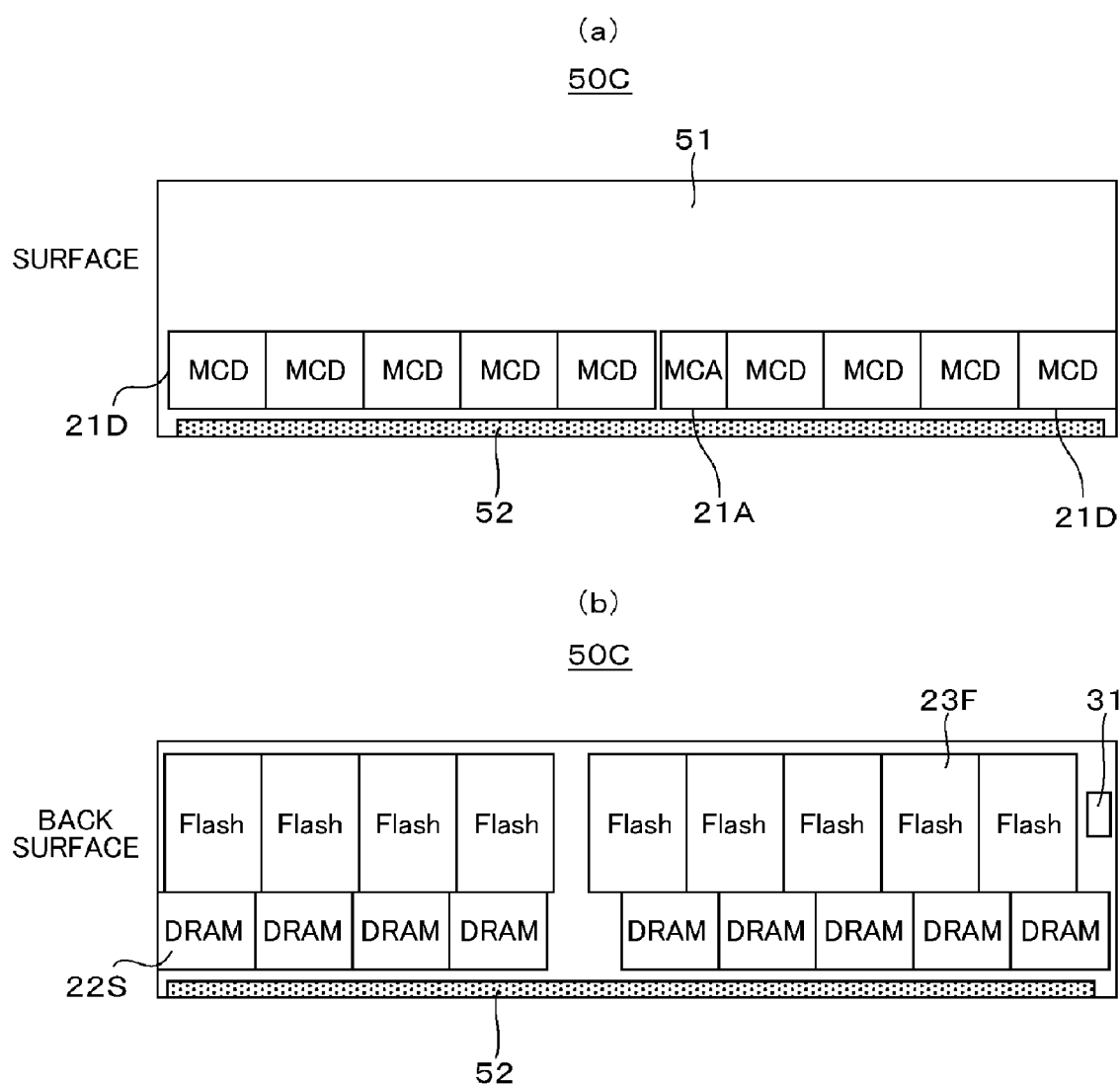

F I G. 1 3
(a)
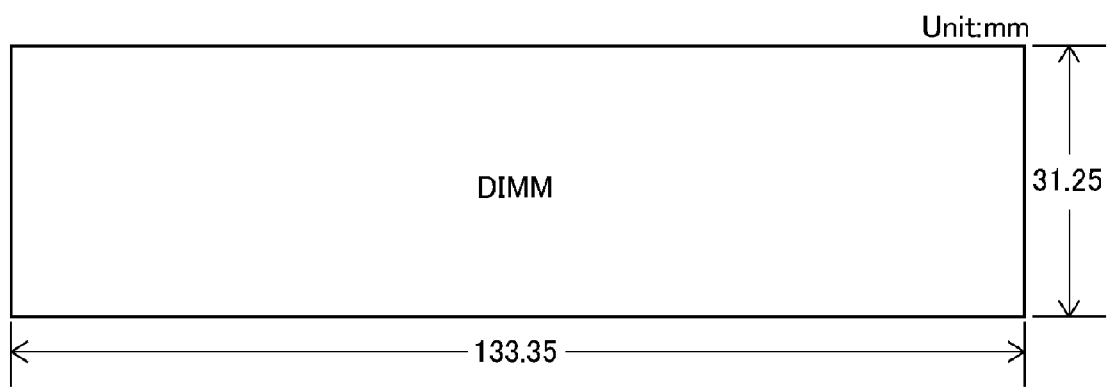
(b)
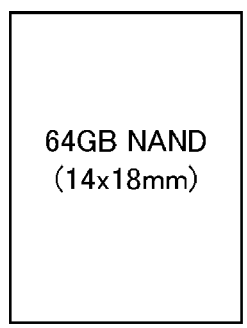
(c)
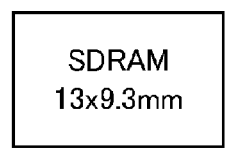

F I G. 1 4
(a)
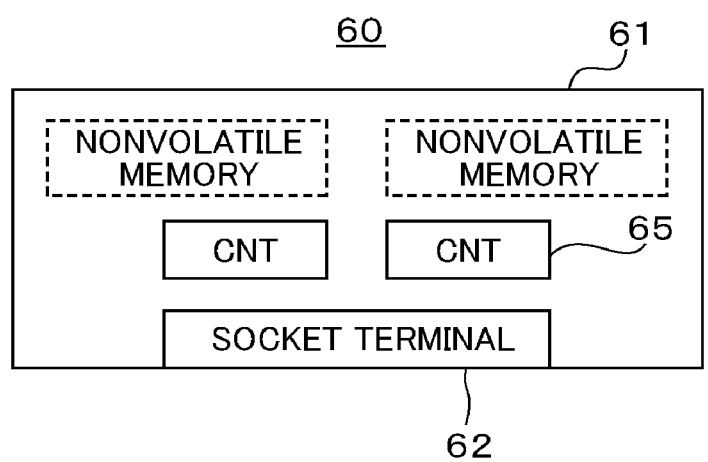
(b)
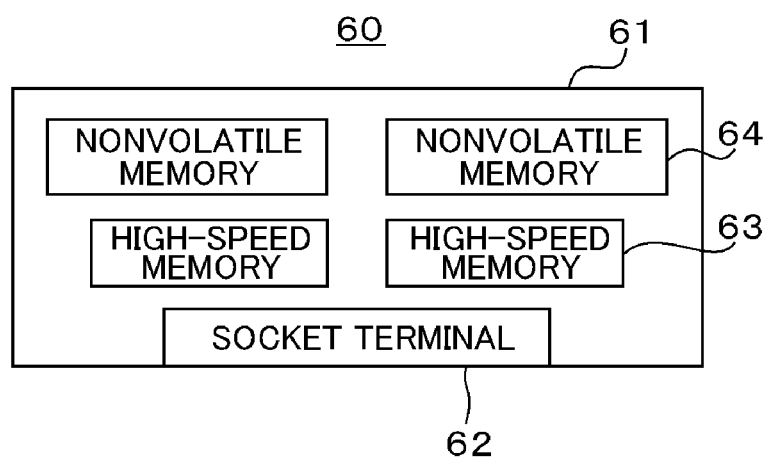

DRAM WITH SDRAM INTERFACE, AND HYBRID FLASH MEMORY MODULE

TECHNICAL FIELD

The present disclosure relates to a memory module and, more particularly, to a hybrid memory module that includes nonvolatile memories and volatile memories, for example.

BACKGROUND ART

In the field such as a server, there has been a growing need for high-speed access to massive data such as those in databases (DB) in the coming era of big data. Given delays in three-dimensional memory mounting technology (TSV), that need has yet to be met by a trend of main storages getting ever-larger capacities, each of main storage being made up of DRAMs (Dynamic Random Access Memory). Moreover, there exists a difference of approximately $10^6$ in throughput (latency) between the DRAMs and SSDs (Solid State Drive) or HDDs (Hard Disk Drive) serving as auxiliary storages connected through SAS (Serial Attached SCSI).

Commercial production is expected of SSDs (PCI-SSD) connected through PCI (Peripheral Component Interconnect Express) and having a response speed between DRAMs and SSDs (SAS-SSD) connected through SAS. The market of the SSDs (PCI-SSD) is also expected to expand.

As a result of a prior art search conducted after the present invention was made, Patent Document 1 was extracted as a related document. Patent Document 1 discloses an FBDIMM (Fully Buffered DIMM) in which flash memories and DRAMs mounted on different DIMMs (Dual Inline Memory Module) are connected in the daisy-chain style via serial transmission buffer elements mounted on each module in a serial transmission system. In accordance with the FBDIMM signal transmission protocol, memory controllers transmit serialized control signals, address signals, and write data signals to the DIMMs and receive serialized read data signals therefrom.

PRIOR ART DOCUMENT

Patent Document

Patent Document 1: Japanese Unexamined Patent Application Publication No. 2010/524059

SUMMARY OF THE INVENTION

Technical Problems to be Solved by the Invention

Although the throughput of the PCI-SSD has become higher than that of the SAS-SSD, there exists a difference of $10^3$ in throughput between the DRAM and the PCI-SSD. Data read throughput is a bottleneck to the computing power of information processing apparatuses, such as servers dealing with big data. In order to obtain better performance, the inventors considered mounting inexpensive large-capacity memories on the CPU memory bus having the widest throughput bandwidth. As a result, the inventors found the following problem.

That is, when DRAMs that are high-speed memories and flash memories that are lower in speed but larger in capacity than the DRAM are to be mounted on the DIMM, what matters in maximizing CPU memory bus throughput is the arrangement of the mounted components.

Means for Solving Problems

Of the inventions disclosed herein, the representative one is briefly explained as follows.

That is, there is provided a memory module including a plurality of memory controllers arranged on the module surface close to a DIMM socket terminal, and a plurality of high-speed memory arranged on the back surface. A plurality of nonvolatile memories are arranged on the side farther from the DIMM socket terminal.

Effect of the Invention

The above-described memory module improves CPU memory bus throughput.

BRIEF DESCRIPTION OF DRAWINGS

FIG. 3A depicts diagrams showing structures of an SDRAM memory module.

FIG. 3B is a diagram showing the arrangement of terminals on the surface of the SDRAM memory module.

FIG. 3C is a diagram showing the arrangement of terminals on the back surface of the SDRAM memory module.

FIG. 3D is a diagram showing the functions etc. assigned to the terminals of the SDRAM memory module.

FIG. 4A is a detailed block diagram of a hybrid memory module according to the embodiment.

FIG. 4D is a block diagram of an input/output buffer part of a data memory controller according to the embodiment.

FIG. 5 is a diagram showing an address space of the hybrid memory module according to the embodiment.

FIG. 8A is a diagram showing the arrangement of terminals on the SDRAM.

FIG. 8B is a diagram showing the function etc. assigned to the terminals on the SDRAM.

FIG. 9 is a diagram showing signal transmission paths in the hybrid memory module according to the embodiment.

FIG. 10 depicts diagrams showing the arrangement of components in a hybrid memory module as a first variation of the embodiment.

FIG. 12 depicts diagrams showing the arrangement of components in a hybrid memory module as a third variation of the embodiment.

FIG. 13 depicts diagrams showing the dimensions of a memory module and memories studied prior to the present disclosure.

FIG. 14 depicts diagrams showing a structure of the memory module according to the embodiment of the present Invention.

MODE FOR CARRYING OUT THE INVENTION

Figure 1:
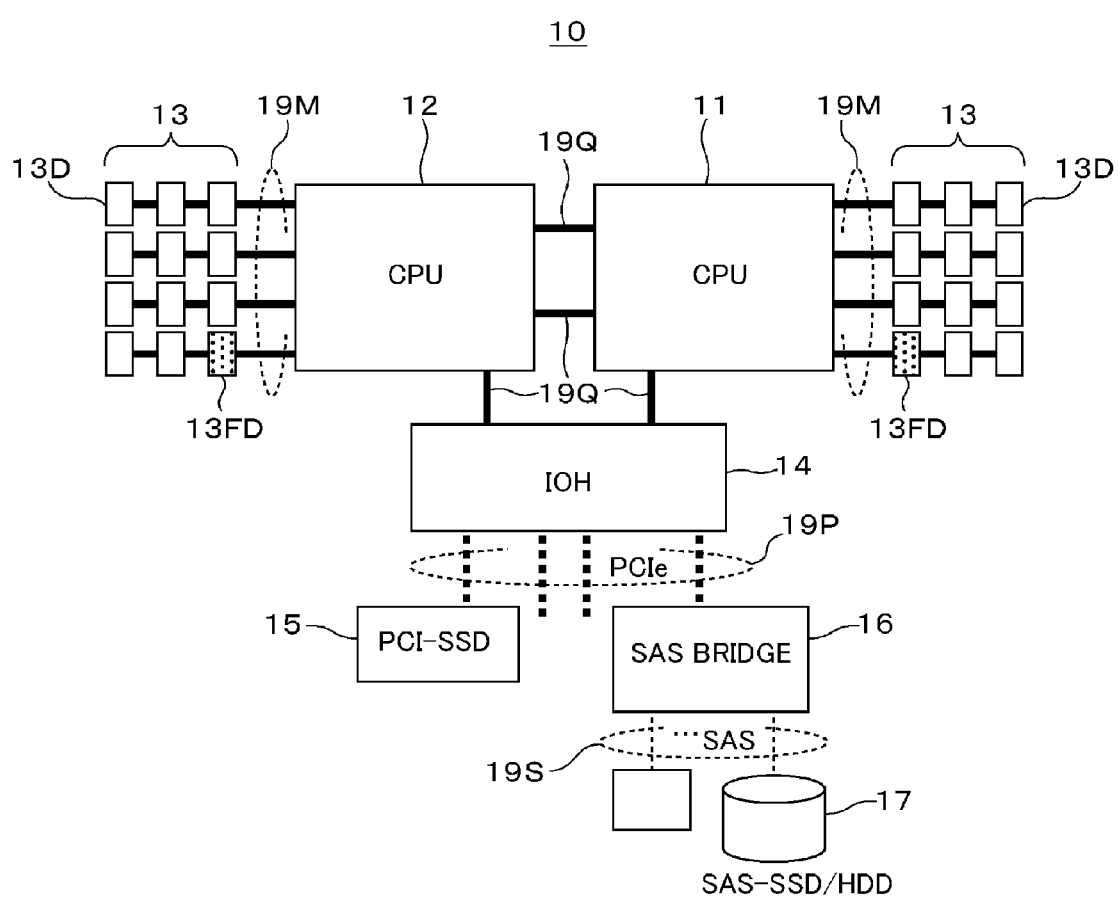
FIG. 1 is a diagram showing a structure of a server according to one embodiment of the invention.

The mode for carrying out the present invention, an embodiment of the invention, and variations of the embodiment will be explained below with reference to the accompanying drawings. Throughout the drawings for explaining the mode for carrying out the present invention, the embodiment of the invention, and the variations of the embodiment, the same reference characters designate the same or corresponding parts, and their descriptions are omitted where redundant.

In the present disclosure, a DRAM refers to a memory for use in the main storage, including clock synchronous DRAMs (generically called the SDRAM hereunder) such as SDRAM (Synchronous DRAM), DDR-SDRAM (Double Data Rate SDRAM), DDR2-SDRAM, DDR3-SDRAM, and DDR4-SDRAM. A DIMM, referring to a memory module that has multiple packaged memories, is used in the main storage (primary storage) and complies with the JDEC standard in terms of functions, sizes, and pin arrangements. A memory bus refers to a bus that connects the CPU to the main storage and has a relatively wide data bus width of, for example, 64 bits. The memory bus is not connected to any device other than the CPU and the main storage. An I/O bus refers to a bus that connects the CPU with input/output devices and auxiliary storage (secondary storage) and has a relatively narrow data bus width of, for example, eight bits. The CPU includes memory controllers that control arithmetic units (CPU core), cache memories, and external memories.

1. Techniques Considered Prior to the Present Disclosure

The inventors considered mounting on the DIMM the SDRAMs that are high-speed memories and flash memories that operate at lower speed but offer larger capacity than the SDRAM. The DIMM to be mounted on a standard 1 U server is subject to dimensional constraints. As shown in FIG. 13(a), the DIMM measures 133.35 mm in width and 31.25 mm in height. As shown in 13(b), a 64 GB NAND type flash memory measures 14 mm by 18 mm. As shown in FIG. 13(c), the SDRAM measures 13 mm by 9.3 mm. It is necessary to mount at least nine flash memories, nine SDRAMs, and memory controllers controlling these memories, all on a DIMM (this DIMM is called a hybrid memory DIMM). It is also necessary to make the bus throughput of the hybrid memory DIMM approximately the same as that of the conventional DIMM carrying SDRAMs.

That is, making the best use of SDRAM interface (I/F) throughput requires securing the bandwidth of the interface for low-speed flash memories in an interleaved fashion. It is thus necessary to mount numerous flash memories. Also, in order to maintain high-speed performance of the SDRAM interface, it is necessary to minimize the length of the wiring between the DIMM socket terminal and the memory controllers, as well as the length of the wiring between the memory controllers and the SDRAMs.

In a setup where a single buffer IC or a single control IC is arranged at the center of the memory module, as in the RDIMM (Registered DIMM), FBDIMM (Fully Buffered DIMM), and LRDIMM (Load Reduced DIMM), the length of the wiring such as data lines tends to be long between the IC and the SDRAMs that are located away from the IC. Also, the need to install many lines between the IC and the numerous flash memories over the DIMM substrate makes the layout of wiring difficult.

2. Mode of the Invention

FIG. 14 depicts diagrams showing structures of a memory module as a mode of the invention. A memory module 60 includes a substrate 61, a socket terminal 62, multiple high-speed memories 63, multiple nonvolatile memories 64 that are large-capacity memories having larger capacities than the high-speed memories, and multiple controllers 65. The controllers 65 are mounted on the side of the socket terminal 62 on a first surface of the substrate 61, and the high-speed memories 63 are mounted on a second surface of the substrate 61. The nonvolatile memories 64 are located farther from the socket terminal 62. In other words, the nonvolatile memories 64 are mounted on the opposite side of the socket terminal 62 across the controllers 65. Also, the nonvolatile memories 64 are mounted on the opposite side of the socket terminal 62 across the high-speed memories 63.

The above-described structures makes it possible to connect the controllers 65 to the high-speed memories 63 at short distances over which high-speed data transmission is required, and connect the socket terminal 62 to the controllers 65 also at short distances where high-speed data transmission is needed.

Embodiment

Although this embodiment will be explained below in the form of a server, as a typical information processing apparatus, the present invention may also be applied to information processing apparatuses other than the servers, such as PCs (Personal Computer). Although an ECC-equipped memory module will be explained below as a typical memory module, the invention may also be applied to memory modules devoid of the ECC. Furthermore, although the SDRAM (DRAM) will be explained below as the high-speed memory, the high-speed memory may also be an MRAM (Magnetic Random Access Memory), an STT (Spin Transfer Torque)-RAM, a phase change memory, or the like. The SDRAM is also a typical volatile semiconductor memory that cannot retain data when disconnected from a power source. Although the flash memory will be explained below as a typical nonvolatile memory, the nonvolatile memory is not limited to flash memories. Any semiconductor memory will do as long as it can retain data even when disconnected from the power source and can hold more data than the high-speed memory.

<Overall Structure>

FIG. 1 is a diagram showing a structure of a server according to one embodiment of the present invention. The server 10 includes two CPUs 11 and 12, multiple memory modules 13, an IOH (Input Output Hub) 14, a PCI-SSD 15, a SAS (Serial Attached SCSI) bridge 16, and a SAS-SSD/ HDD 17. The CPUs 11 and 12 are interconnected via two QPI (QuickPath Interconnect) buses 19Q. The CPUs 11 and 12 are each connected to a four-channel memory bus 19M. A one-channel memory bus 19M has a data width of 8 B (bytes) supplemented with 1 B (byte) of ECC data. Each one-channel memory bus 19M can be connected to up to three memory modules 13. The CPUs 11 and 12 and the IOH 15 are interconnected to each other via QPI buses 19Q. The IOH 15 is connected to the PCI-SSD 15 via a PCIe bus 19P.

The IOH 15 is also connected to the SAS bridge 16 via the PCIe bus 19P. The SAS bridge 16 is connected to the SAS-SSD/HDD 17 via a SAS bus 19S. The presence of the CPU 12 and the memory modules connected thereto is optional.

The memory modules 13 include a memory module 13D mounted with SDRAMs (SDRAM memory modules) and a memory module 13FD mounted with flash memories and SDRAMs (hybrid memory modules). For example, the memory buses 19M of the CPUs 11 and 12 are each connected to eleven memory modules 13D and one memory module 13FD. When the memory module 13FD is connected to the memory bus 19M, the module should preferably be at the closest position to the CPU 11 or 12. When multiple memory modules 13FD are connected to the memory bus 19M, they should each be connected to a different channel of the memory bus 19M, but not to the same channel thereof. The memory modules 13D and 13FD are each accessed by the CPUs 11 and 12 through an SDRAM memory interface.

Figure 2:
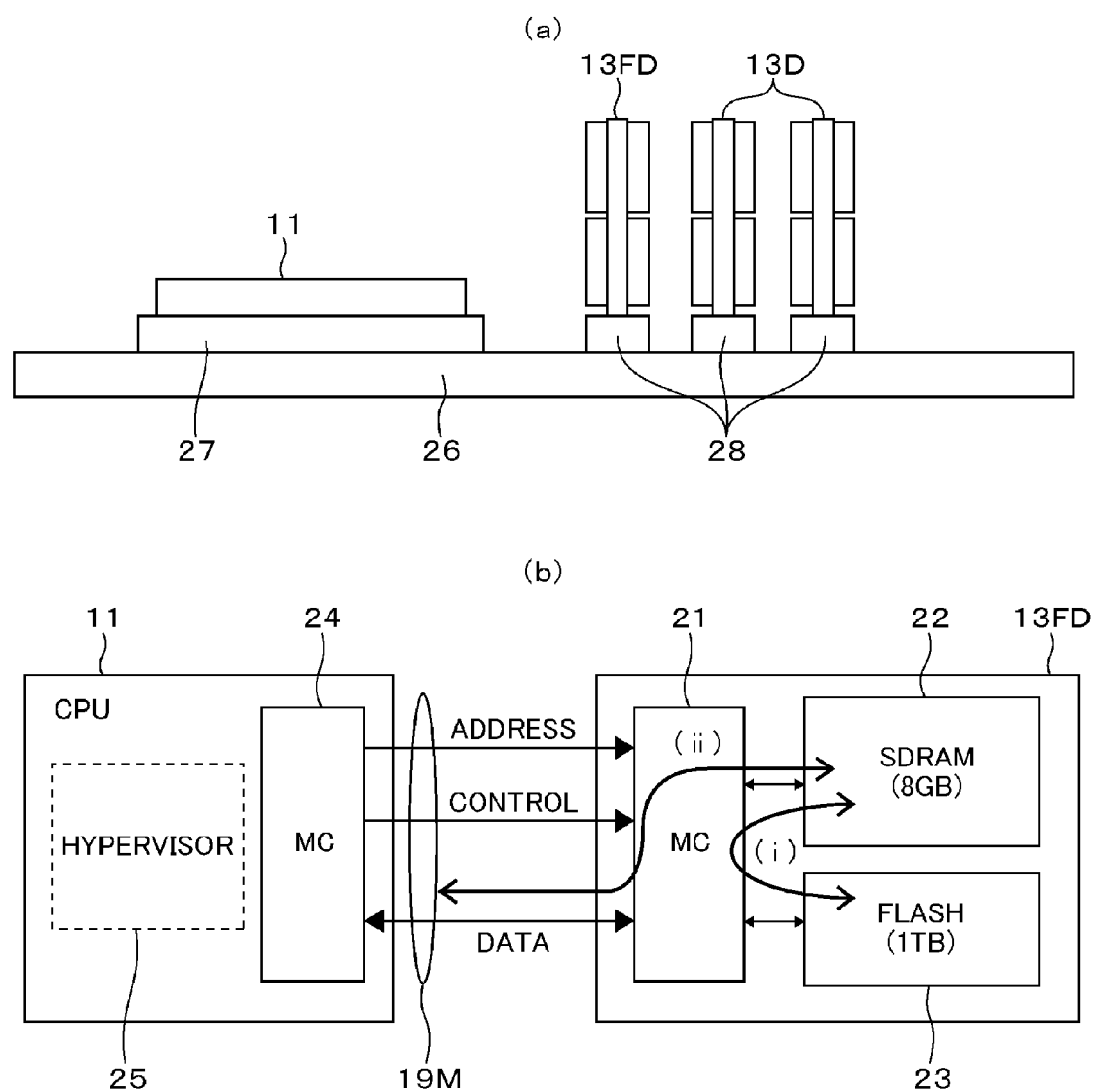
FIG. 2 depicts block diagrams of a memory module according to the embodiment.

FIG. 2 shows partial structures of the server according to the embodiment. FIG. 2(a) is a side view of a substrate on which the CPUs and memory modules are mounted. The CPU 11 is attached to a socket 27 mounted on the substrate (motherboard) 26. The memory modules 13D and 13FD are attached to sockets 28 mounted on the substrate 26. The CPU 12 and memory modules 13D and 13FD are attached likewise. What follows is an explanation about the CPU 11. The explanation of the CPU 12 is omitted because the CPUs 11 and 12 are much alike.

FIG. 2 (b) is a block diagram of a CPU and a hybrid memory module. The CPU 11 incorporates a memory controller 24 that controls the memory modules 13D and 13FD. A hypervisor 25 controls the memory controller 24. The CPU 11 includes a cache memory, not shown, which stores the data read from the memory modules 13D and 13FD by the memory controller 24. The hybrid memory module 13FD includes a memory controller (MC) 21, an SDRAM 22, and a flash memory (FLASH) 23. For example, the SDRAM 22 has a capacity of 8 GB and the flash memory 23 has a capacity of 1 TB. The memory controller 21 interfaces between the memory bus 19M on the one hand and the SDRAM 22 and flash memory 23 on the other hand.

<Overall Operation>

When data is read from the flash memory 23 in the hybrid memory module 13FD, first, the memory controller 21 reads the data of interest from the flash memory 13 and writes it to the SDRAM 22, then, the memory controller 21 reads the data from the SDRAM 22.

When data is written to the flash memory 23 in the hybrid memory module 13FD, first, the memory controller 21 writes the data of interest to the SDRAM 22, then, the memory controller 21 reads the data from the SDRAM 22 and writes it to the flash memory 23.

A path (i) through which data is read from the flash memory 23 and written to the SDRAM 22 is not routed via the memory bus 19M. Only the path (ii) through which data is read from the SDRAM 22 is routed via the memory bus 19M. In this manner, data throughput can be maximized up to the limit of the memory bus capacity.

<Structure of the SDRAM Memory Module>

FIG. 3A shows structures of an SDRAM memory module. FIG. 3A (a) shows the surface of the module, and FIG. 3A (b) shows the back surface of the module. FIG. 3B is a diagram showing the arrangement of terminals on the surface of the SDRAM memory module. FIG. 3C is a diagram showing the arrangement of terminals on the back surface of the SDRAM memory module. FIG. 3D is a diagram showing the function etc. assigned to the terminals of the SDRAM memory module.

The SDRAM memory module 13D uses a 240-pin RDIMM (Registered DIMM) made up of DDR3-SDRAMs complying with the JEDEC standard. The RDIMM is a DIMM that receives an address signal and a control signal into an IC (Integrated Circuit) called a registered buffer on the DIMM substrate and shapes and amplifies the signals before distributing them to each SDRAM. As shown in FIG. 3A, eighteen SDRAMs 24, one registered buffer IC 43F, and one SPD (Serial Presence Detect) 44 are mounted on the surface of the substrate 41 of the SDRAM memory module 13D. On the back surface of the substrate 41, eighteen SDRAMs 24 and one registered buffer IC 43R are mounted. Two SDRAMs 24 on the surface and two SDRAMs 24 on the back surface are for ECC data. That is, the SDRAM memory module 13D is an ECC-equipped 32 GB RDIMM. Data is handled in 4 Gb by 64 and ECC in 4 Gb by 8. The SDRAMs 24 are each an 8 Gb (1 Gb by 8) DDR3-SDRAM including two 4 Gb (1 Gb by 8) DDR3-SDRAM chips mounted on a BGA package. The memory module 13D may be an LRDIMM (Load-Reduced DIMM) in which data signals are also buffered. In this case, the arrangement of the terminals on the LRDIMM and the functions assigned to the terminals are the same as those of the RDIMM.

As shown in FIGS. 3B and 3C, terminals 42F and 42R each include 120 terminals. The function etc. assigned to the terminals are listed in FIG. 3D. In FIG. 3D, a lower-case suffix "x" following upper-case symbols indicates that there exist multiple terminals having the same function. In FIGS. 3B and 3C, the suffix "x" is replaced with numbers. A symbol "#" indicates an active-low signal.

<Structure of the Hybrid Memory Module>

(Overall Structure)

Figure 4B:
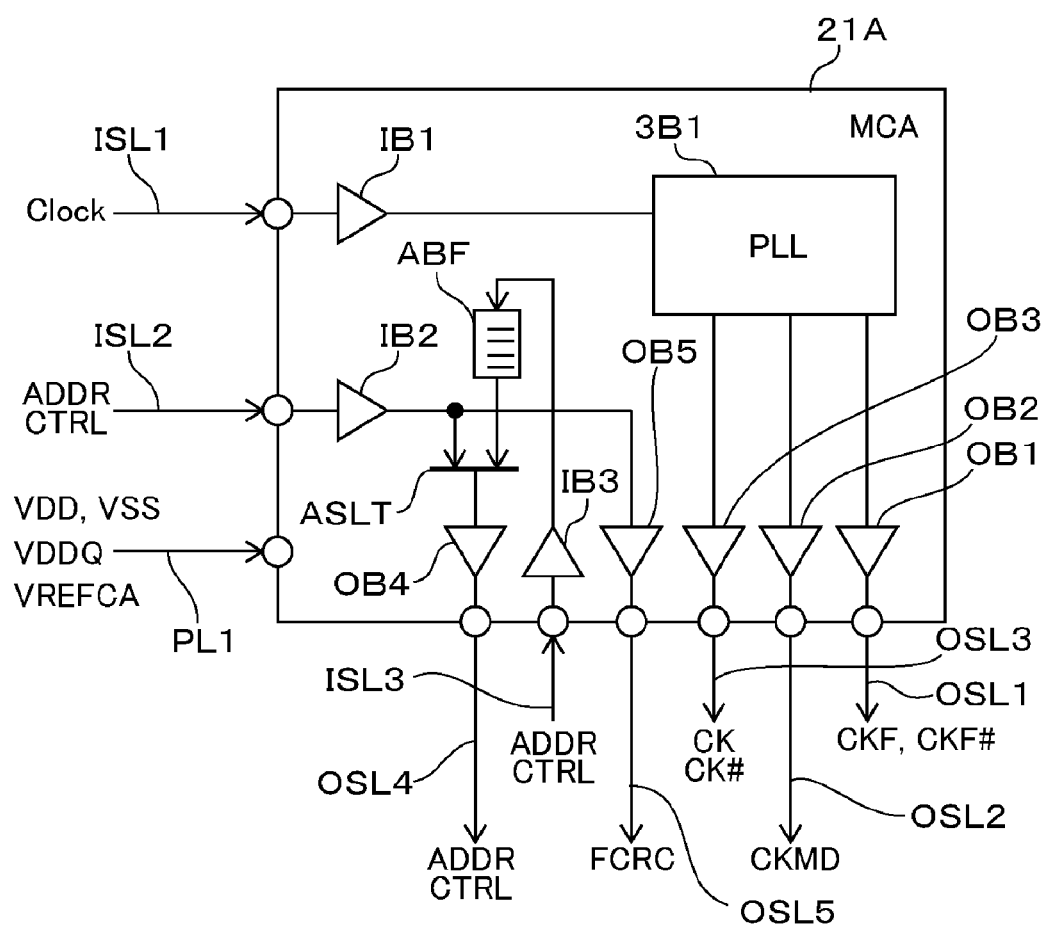
FIG. 4B is a block diagram of an address memory controller according to the embodiment.
Figure 4C:
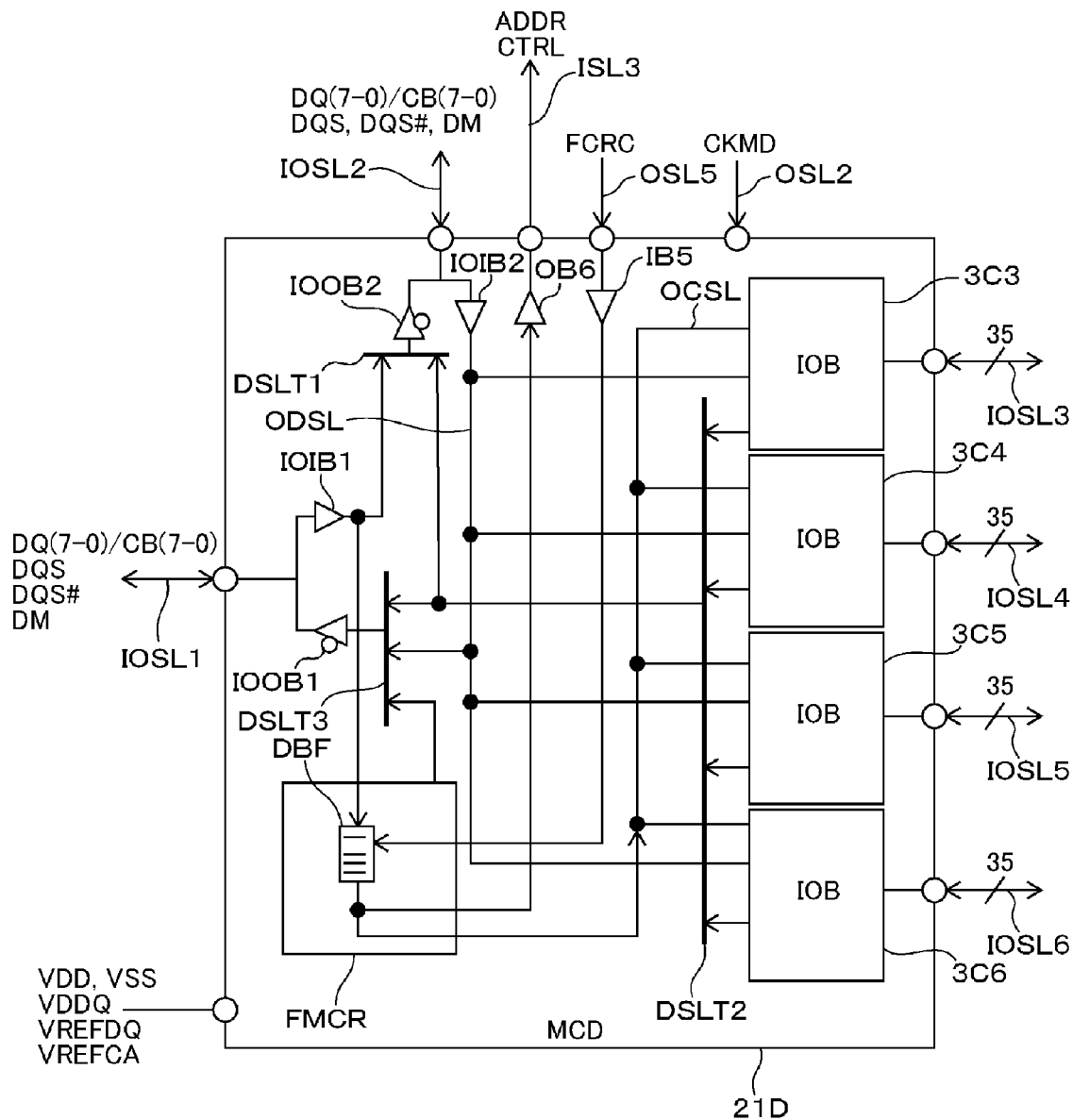
FIG. 4C is a block diagram of a data memory controller according to the embodiment.
Figure 4E:
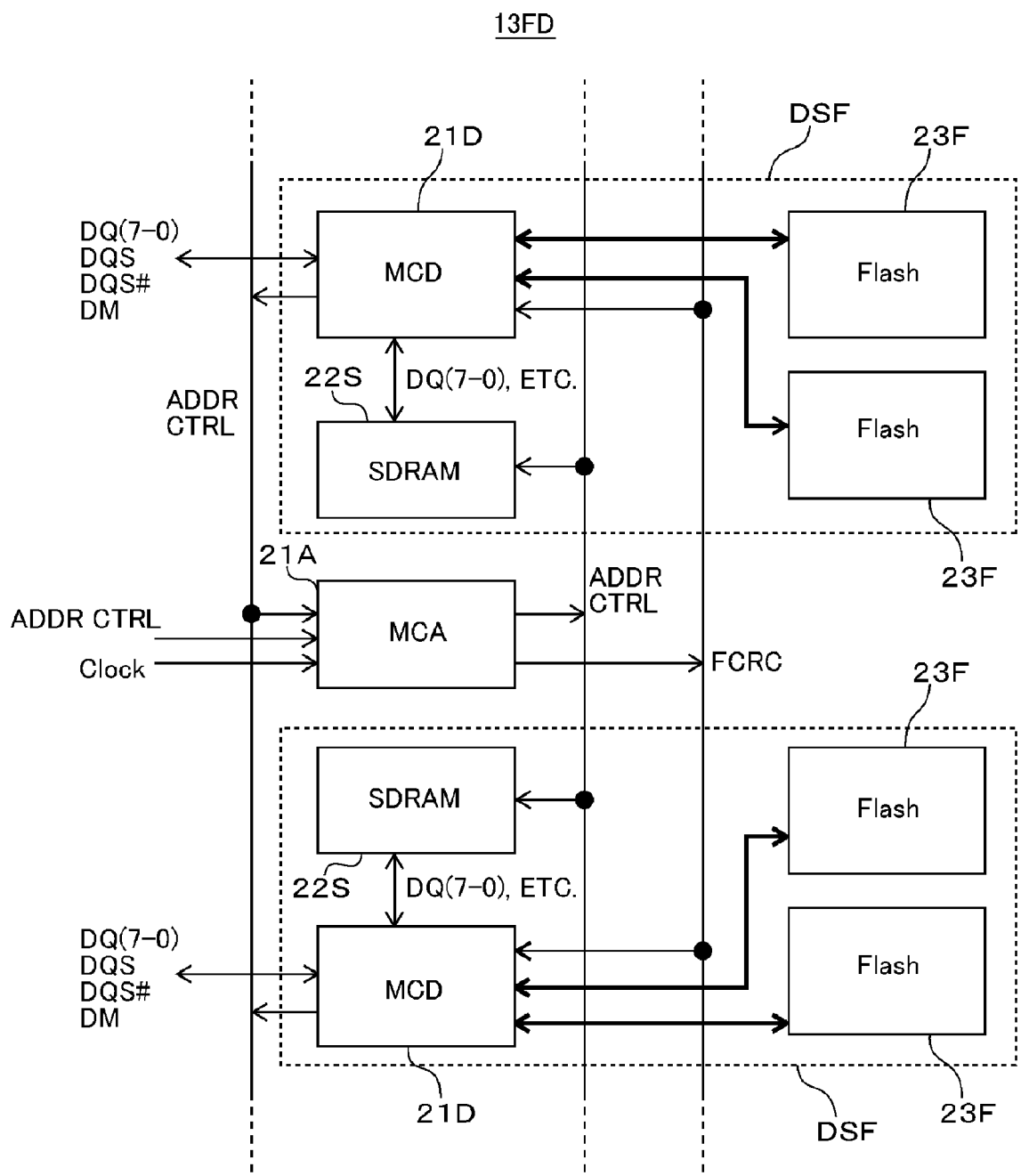
FIG. 4E is a block diagram showing part of the hybrid memory module according to the embodiment.

FIG. 4A is a diagram showing an overall structure of a hybrid memory module according to the embodiment. FIG. 4B is a block diagram of an address memory controller. FIG. 4C is a block diagram of a data memory controller. FIG. 4D is a diagram showing a flash memory input/output buffer circuit. FIG. 4E is a block diagram showing part of the memory module according to the embodiment.

As shown in FIG. 4A, the hybrid memory module 13FD includes an address memory controller (MCA) 21A, a data memory controller (MCD) 21D, an SDRAM 22S, and flash memories 23F. The address memory controller 21A and the data memory controller 21D make up the memory controller 21. The hybrid memory module 13FD carries as many data memory controllers 21D as the configured SDRAMs 22S. One address memory controller 21A is mounted on the hybrid memory module 13FD. The memory module 13FD carries twice as many flash memories 23F as the SDRAMs 22S.

More specifically, eighteen flash memories 23F with a capacity of 64 GB each and nine SDRAMs 22S with a capacity of 1 GB each are mounted on the hybrid memory module 13FD. The capacity of the flash memory 23F is sixty-four times larger than that of the SDRAM 22S, i.e., ten or more times and less than a hundred times. Two flash memories 23F and one SDRAM 22S are used to store ECC data; these memories constitute an 8 GB SDRAM 22 and a 1 TB flash memory 23. Further, nine data memory controllers 21D and one address memory controller 21A are mounted on the memory module 13FD. The data memory controllers 21D and the address memory controller 21A are each formed by a semiconductor chip and mounted on a BGA package. Each 64 GB-capacity flash memory 23F includes eight 8 GB NAND-type flash memory chips (NAND Flash) that are stacked one on top of the other so as to be mounted on one BGA package. The flash memories 23F use a DDR2-compatible interface (ONFI [Open NAND Flash Interface] or Toggle DDR) that provides 400 Mbps throughput. As shown in FIGS. 4A and 4E, one data memory controller 21D controls one SDRAM 22S and two flash memories 23F. The SDRAM 22S includes one or a plurality of 1 GB DDR3-SDRAM chips mounted on one BGA package. The interface of the SDRAM 22S provides 1600 Mbps throughput. The SDRAM 22 may use DDR4-SDRAM chips instead of the DDR3-SDRAM chips. It should be noted that the read time of the flash memory 23F is longer than that of the SDRAM 22S. The read time of the flash memory 23F is on the order of 10 μs. On the other hand, the read time of the SDRAM 22S is on the order of 10 ns. Here, the read time is a time period that elapses from the time a read command is issued until the first data is read out.

The hybrid memory module 13FD also includes an SDP (Serial Presence Detect) 31 and a DC-DC converter 33. The SPD 31 and the SPD 44 each include an EEPROM that holds information about the memory module itself (e.g., types and structures of memory chips, memory capacities, and the presence or absence of ECC [error-correcting code] and parity). When the memory module is attached and powered, the information held in the SPDs 31 and 44 is automatically read out to make the settings necessary for using the memory module. The DC-DC converter 32 generates the line voltage for the flash memory 13F (VDDFlash=1.8V) from the source voltage for the SPD 31 (VDDSPD=3.3V). If a reserved pin (NC pin) of the memory module can be assigned to a VDDFlash source terminal, the DC-DC converter 33 is not necessary.

The hybrid memory module 13FD also has socket terminals for connection to the memory bus 19M. The socket terminals have the same number of terminals, the same assignment of the terminals, and the same functions assigned thereto as the terminals 42F and 42R of the SDRAM memory module 13D (see FIGS. 3B, 3C and 3D). In FIG. 4A, hollow circles represent the socket terminals. The socket terminals are fed with a clock signal (Clock), an address signal (ADDR), a control signal (CTRL), a data signal (DQ, CB), a data control signal (DQS, DQS#, DM), a power source (VDD, VSS, VDDQ, VREFDQ, VREFCA, VDDSPD, VDDFlash), and an SPD signal, etc. The clock signal (Clock) includes a clock signal (CK, CK#) for the SDRAM 22S. The address signal (ADDR) includes an address signal (A15-A0) and a bank address signal (BA2-BA0) for the SDRAM 22S. The control signal (CTRL) includes a command signal (RAS#, CAS#, WE#) and a control signal (CKE, S#). Here, RAS# stands for a row address strobe signal, CAS# for a column address strobe signal, and WE# for a write enable signal. The signals from the socket terminals necessary for access to the SDRAM 22S and the flash memory 23F are input temporarily to the address memory controller 21A or the data memory controller 21D.

(Address Memory Controller)

As shown in FIG. 4B, the address memory controller 21A includes a PLL 3B1, a buffer register ABF, and a selector ASLT. The clock signal (Clock) on a signal line ILS1 is input to the PLL (Phase Loop Lock) circuit 3B1 via an input buffer circuit IB1. The PLL circuit 3B1 outputs a clock signal (CKF) for the flash memory 23F onto a signal line OSL1 via an output buffer circuit OB1, a clock signal (CKMD) for the data memory controller 21D onto a signal line OSL2 via an output buffer circuit OB2, and the clock signal (CK, CK#) for the SDRAM 22S onto a signal line ODL3 via an output buffer circuit OB3. The clock signal (Clock), the clock signal (CK, CK#), and the clock signal (CKMD) have the same frequency. The clock signal (CKF, CKF#) has one-fourth of the frequency of the clock signal (Clock), the clock signal (CK, CK#), and the clock signal (CKMD). A divider in the PLL 3B1 generates the one-fourth frequency clock signal.

The address signal (ADDR) and the control signal (CTRL) on a signal line ISL2 are input to the selector ASLT via an input buffer circuit IB2. From there, the address signal (ADDR) and the control signal (CTRL) for the SDRAM 22 are output onto a signal line OSL4 via an output buffer circuit OB4. Part of the address signal (ADDR) and the control signal (CTRL) is output via an output buffer circuit OB5 onto a signal line OSL5 as a control signal (FCRC) for a control register FMCR to be discussed later. The address signal (ADDR) and the control signal (CTRL) output from the flash memory control register FMCR on a signal line ISL3 are stored in the buffer register ABF via an input buffer circuit IB3. These signals are used when the data in the flash memory 23F is written to the SDRAM 22S or the data in the SDRAM 22S is written to the flash memory 23F. The address signal (ADDR) and the control signal (CTRL) stored in the buffer register ABF are input to the selector ASLT and output onto the signal line OSL4 via the output buffer circuit OB4.

The power source (VDD, VDDQ, VREFDQ, VSS) on a power line PL is input. In FIG. 4B, hollow circles between the signal lines and the input or output buffer circuits represent the external terminals of the address memory controller 21A. There are as many external terminals as the signal lines connected thereto.

Data Memory Controller

As shown in FIG. 4C, the data memory controller 21D includes selectors DSLT1, DSLT2 and DSLT3, and the control register FMCR. Data-related signals (DQ(7-0)/CB (7-0), DQS, DQS#, DM) directed to the SDRAM 22S are output onto a signal line IOSL2 via a signal line IOSL1, an input buffer circuit IOIB1, the selector DSLT1, and an output buffer circuit 100B2. The signal line IOSL2 is connected to the SDRAM 22S. The data-related signals from the SDRAM 22S are output onto the signal line IOSL1 via the signal line IOSL2, an input buffer circuit IOIB2, a signal line ODSL, the selector DSLT3, and an output buffer IOOB1.

The information necessary for the flash memory 23F is input from a DQ(7-0) signal transmission line as part of the signal line IOSL1 and is written to a buffer register DBF in the control register FMCR. The information needed for the flash memory 23C includes a flash memory operation code FMOPC, a flash memory address FMADDR, and the address signal (ADDR) and control signal (CTRL) for access to the SDRAM 22S. The control register FMCR is accessed through the SDRAM memory interface.

Input/output buffer parts (IOB) 3C1, 3C2, 3C3 and 3C4 are each connected to the flash memory 23F and signal lines IOSL3, IOSL4, IOSL5 and IOSL6. The signal lines IOSL3, IOSL4, IOSL5 and IOSL6 each include thirty-five lines, i.e., four sets of eight address/data lines, two data strobe lines, and one data mask line. As shown in FIG. 4D, the input/output buffer parts IOB3C3, 3C4, 3C5 and 3C6 each include output buffer registers ODBCi and ODBDi, an input buffer register IDBFi, a selector FDSLTi, an output buffer circuit IOOBi, and an input buffer circuit IOIBi, where i=3 to 6. The output buffer registers ODBCi and ODBDi are connected to signal lines OCSL and ODSL, respectively. The signal line OCSL is connected to the data buffer register DBF. The signal line ODSL is connected to the input buffer circuit IOIB2.

The DIMM has approximately at its center the socket terminals for the address signal (ADDR), the control signal (CTRL), and the clock signal (Clock). Thus as shown in FIG. 4E, the address memory controller 21A should preferably be located approximately at the center of the memory module 13FD. FIG. 4E shows, in its upper and lower parts, only two sections DSF each formed by enclosing one data memory controller 21D, one SDRAM 22S, and two flash memories 23F with broken lines. However, there may be provided five sections DSF in the upper part and four sections DSF in the lower part, for example.

(Operation)

The hybrid memory module 13FD operates on the so-called SDRAM interface. In accordance with the value of an externally input address signal (ADDR), the address memory controller 21A selects access either to the control register FMCR in the data memory controller 21D or to the SDRAM 22S. Either choice of access is carried out through SDRAM interfacing. When the control register FMCR is accessed with the operation code (FMOPC) and the address (FMADDR) written thereto, it is possible to load data from the flash memory 23F into the SDRAM 22S or store data from the SDRAM 22S into the flash memory 23F.

(1) Reading from the Hybrid Memory Module (a) Reading from the Flash Memory

The memory controller 24 inputs an address to the address signal (ADDR) for gaining access to the control register FMCR. The memory controller 24 also inputs a write command to the control signal (CKE, CS#, RAS#, CAS#, WE#). The memory controller 24 further inputs to the data signal (D7-DQ0) a load command code as FMOPC, the address at which to start loading data from inside the flash memory 23F, and the write address to which to write the data in the SDRAM 22S. In turn, the address memory controller 21A inputs the control signal (FCRC) to the control register FMCR via the signal line OSL5 and the input buffer circuit IB5. Then the load command code, the load start address, and the SDRAM write address are written to the control register FMCR.

Thereafter, a control circuit, not shown, reads the load command code and load start address and sends them to the output buffer register ODBCi in the input/output buffer part (IOB) via the signal line OCSL. The data of interest is read from the flash memory 23F when the memory 23F is fed with the load command code and the load start address along with the control signal (AL, CL, E#, R, W, RP#, DQS) of the flash memory 23F generated by the control circuit which is not shown. The read data is written to the input buffer register IDBFi in the input/output buffer part (IOB).

(b) Writing from the Input Buffer Register to the SDRAM

The SDRAM write address held in the buffer register DBF and the control signal (CTRL) generated by the control circuit, not shown, are output onto the signal line ISL3 via an output buffer circuit OB6. The address and the signal are forwarded to the SDRAM 22S via the address memory controller 21A as described above. Also, the data held in the input buffer register IDBFi is output onto the signal line IOSL2 via the selector DSLT2, the selector DSLT1, and an output buffer circuit 100B2. This causes the data read from the flash memory 23F to be written to the SDRAM 22S.

(c) Reading from the SDRAM

For gaining access to the data which is stored in the SDRAM 22S and which was retrieved from the flash memory 23F, the memory controller 24 inputs to the address signal (ADDR) the address (i.e., the same as the SDRAM write address) for accessing the SDRAM 22S and inputs the read command to the control signal (CKE, CS#, RAS#, CAS#, WE#). In turn, the address memory controller 21A access to the SDRAM 22S and reads the data of interest. The data read from the SDRAM 22S is sent to the signal line IOSL1 via the signal line IOSL2, the input buffer circuit IOIB1, the selector DSLT3, and the output buffer circuit IOOB1.

(2) Writing to the Hybrid Memory Module (a) Writing to the SDRAM

The memory controller 24 inputs to the address signal (ADDR) the address for gaining access to the SDRAM 22S. The memory controller 24 also inputs the write command to the control signal (CKE, CS#, RAS#, CAS#, WE#). The memory controller 24 further inputs the write data to the data signal (DQ7-DQ0). In turn, the address memory controller 21A gains access to the SDRAM 22S and writes thereto the data input by the data memory controller 21D via the input buffer circuit IOIB1, the selector DSLT1, and the output buffer circuit IOOB1.

(b) Reading from the SDRAM

The memory controller 24 inputs to the address signal (ADDR) the address for gaining access to the control register FMCR. The memory controller 24 also inputs the write command to the control signal (CKE, CS#, RAS#, CAS#, WE#). The memory controller 24 further inputs to the data signal (DQ7-DQ0) a delete command and a delete address as FMOPC, a store command code, a store start address at which to start storing data in the flash memory 23F, and a read address at which to read the data of interest from the SDRAM 22S. In turn, the address memory controller 21A inputs the control signal (FCRC) to the control register FMCR via the signal line OSL5 and the input buffer circuit IB5. As a result, the delete command, the delete address, the store command code, the store start address, and the SDRAM read address are written to the control register FMCR.

Thereafter, the SDRAM read address held in the buffer register DBF and the control signal (CTRL) generated by the control circuit, not shown, are output onto the signal line ISL3 via the output buffer circuit OB6, before being forwarded to the SDRAM 22S via the address memory controller 21A as described above. In turn, the data is read from the SDRAM. 22S and written to the output buffer register ODBDi in the input/output buffer part (IOB) via the signal line IOSL2 and the input buffer circuit IOIB1.

(c) Writing from the Output Buffer Register to the Flash Memory

Thereafter, the control circuit, not shown, reads the delete command code and the delete address and sends them to the output buffer register ODBCi in the input/output buffer part (IOB) via the signal line OCSL. The delete command code and the delete address, along with the control signal (AL, CL, E#, R, W, RP#, DQS) of the flash memory 23F generated by the control circuit, not shown, are sent to the flash memory 23F in which they are deleted.

Thereafter, the control circuit, not shown, reads the store command code and the store start address and sends them to the output buffer register ODBCi in the input/output buffer part (IOB) via the signal line OCSL. The store command code, the store start address, and the data held in the output buffer register ODBDi are sent to the flash memory 23F along with the control signal (AL, CL, E#, R, W, RP#, DQS) generated by the control circuit, not shown, so that the data is written to the flash memory 23F.

<Control by the CPU>

FIG. 5 is a diagram showing an address space of the server 10. FIG. 5 illustrates the address space of application process addresses, an operating system (OS) page table (Page Table), physical addresses of virtual machines (VM), and physical addresses. The hypervisor operates directly on the hardware, and all operating systems (OS) run on the hypervisor. Applications run on the OS. A virtual machine (VM) is implemented by the hypervisor. An address of a buffer cache secured by the application is assigned to suitable addresses by the OS.

The flash memories in the hybrid memory module 13FD are in an I/O space. Thus the address of the data to be read from a flash memory in the I/O space needs to be assigned to a physical address in the memory address space. Through conversion by the hypervisor, the address of the buffer cache appropriated by the application is assigned to the SDRAM in the hybrid memory module (DIMM). This limits data transmission to within the hybrid memory module only and inhibits needless data transmission to the memory bus.

In addition to performing the above-described controls, the memory controller 24 initializes the SDRAM 22S by making relevant settings to a mode register in the SDRAM 22S. Furthermore, the memory controller 24 carries out the following control.

Repeated write and read operations to and from the flash memories 23F lower their reliability. In some rare cases, rewritten data could turn out to be different when read out, or data could be not written correctly when rewritten. When reading data from the hybrid memory module 13FD, the memory controller 24 detects and corrects error in the data to be read. An error correction circuit in the memory controller 24 performs error detection and correction on the basis of data from two flash memories 23F and one SDRAM 22S each holding ECC data.

When new data is written to replace the old one in the flash memory 23F, the memory controller 24 checks whether the data is correctly written. If it is determined that the data is not correctly written, the memory controller 24 writes the data to an address different from the current address; this process is known as wear leveling. Also carried out is address management involving identification of the defective address and the new address replacing that address.

The CPU 11 thus performs memory management in the hybrid memory module 3FD. This makes it possible to minimize the delay in the memory controller 21.

<Arrangement of Memory Module Components>

Figure 6:
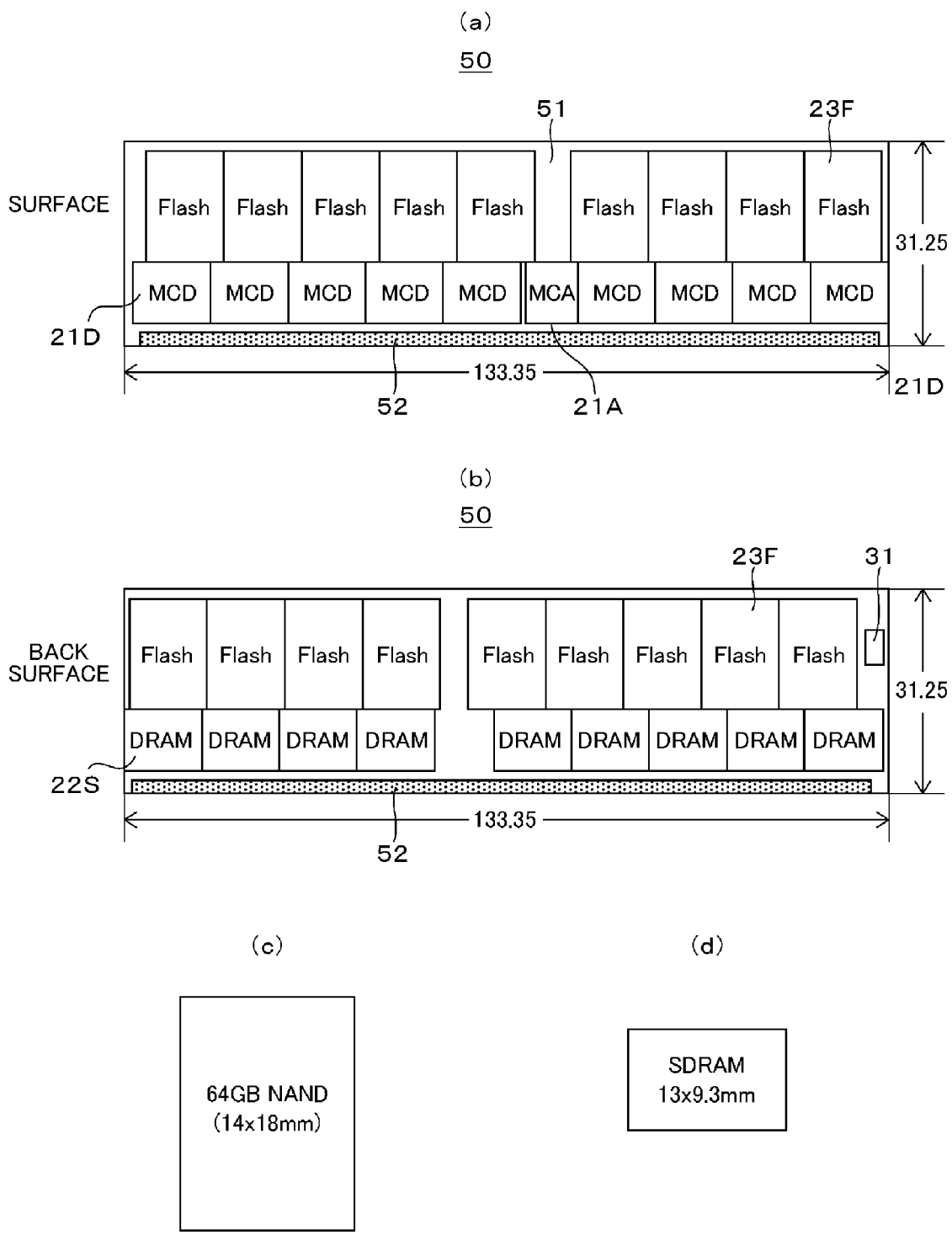
FIG. 6 depicts diagrams showing the arrangement of components in the hybrid memory module according to the embodiment.

FIG. 6 shows the arrangement of components in the hybrid memory module according to the embodiment. FIG. 6(a) shows the surface of the memory module, while FIG. 6(b) shows the back surface thereof. FIG. 6(c) shows the external dimensions of the flash memory and FIG. 6(d) shows the external dimensions of the SDRAM. A DIMM 50 serving as a typical composition example of the hybrid memory module 13FD includes a substrate 51, socket terminals 52 on both sides of the substrate 51, one address memory controller (MCA) 21A, eighteen data memory controllers (MCD) 21D, eighteen SDRAMs (DRAM) 22S, eighteen flash memories (Flash) 23F, and one SPD 31. When the memory module 13FD is inserted into the sockets 28, the side of the module close to (i.e., facing) the CPU 11 is called the surface, and the side of the module farther from (opposite to) the CPU 11 is called the back surface (the same applies hereinafter). The surface and the back surface may be reversed. The substrate 51 measures 133.35 mm in width and 31.25 mm in height.

The address memory controller 21A is arranged with the short sides at its top and bottom, the data memory controllers 21D are arranged with the long sides at its top and bottom, the SDRAMs 22S are arranged with the long sides at its top and bottom, and the flash memories 23F are arranged with the short sides at its top and bottom. Further as shown in FIGS. 6 (c) and 6(d), the flash memory 23F measures externally 14 mm by 18 mm, and the SDRAM 22S measures externally 13 mm by 9.3 mm. The external dimensions of the SDRAM vary from one semiconductor manufacturer to another (in semiconductor chip sizes, etc.); the SDRAMs typically measure 12 mm by 10.5 mm, 10.5 mm by 9.0 mm, 11 mm by 9.9 mm, or 10.6 mm by 9.0 mm. It should be noted that the balls are arranged in the same positions. The external dimensions of the data memory controller 21D are the same as those of the SDRAM 22S.

The data memory controllers 21D and the SDRAMs 22S are arranged, respectively, on the surface and the back surface of the substrate 51 close to the socket terminals 52. The flash memories 23F are located farther from the socket terminals 52 than the data memory controllers 21D and the SDRAMs 22S. In other words, the data memory controllers 21D are arranged on the surface of the substrate 51 between the socket terminals 52 and the flash memories 23F. The SDRAMs are arranged on the back surface of the substrate 51 between the socket terminals 52 and the flash memories 23F. The address memory controller 21A is arranged between the data memory controllers 21D.

As shown in FIG. 6(a), four data memory controllers 21D are arranged on the right side of the address memory controller 21A and five data memory controllers 21D are on the left side. As shown in FIG. 6(b), five SDRAMs 22S and four SDRAMs 22S are arranged, respectively, on the right and left sides of the position at the back of where the address memory controller 21A is located. Also, the SPD 31 is arranged near the rightmost edge of the back surface of the substrate 52.

It is desirable that the positions where the data memory controllers 21D and the SDRAMs 22S are mounted should overlap with one another on the surface and the back surface.

Where the above-described structure is in place, it is possible to connect the data memory controllers 21D to the SDRAMs 22S at short distances and connect the socket terminals 52 to the data memory controllers 21D also at short distances.

Figure 7:
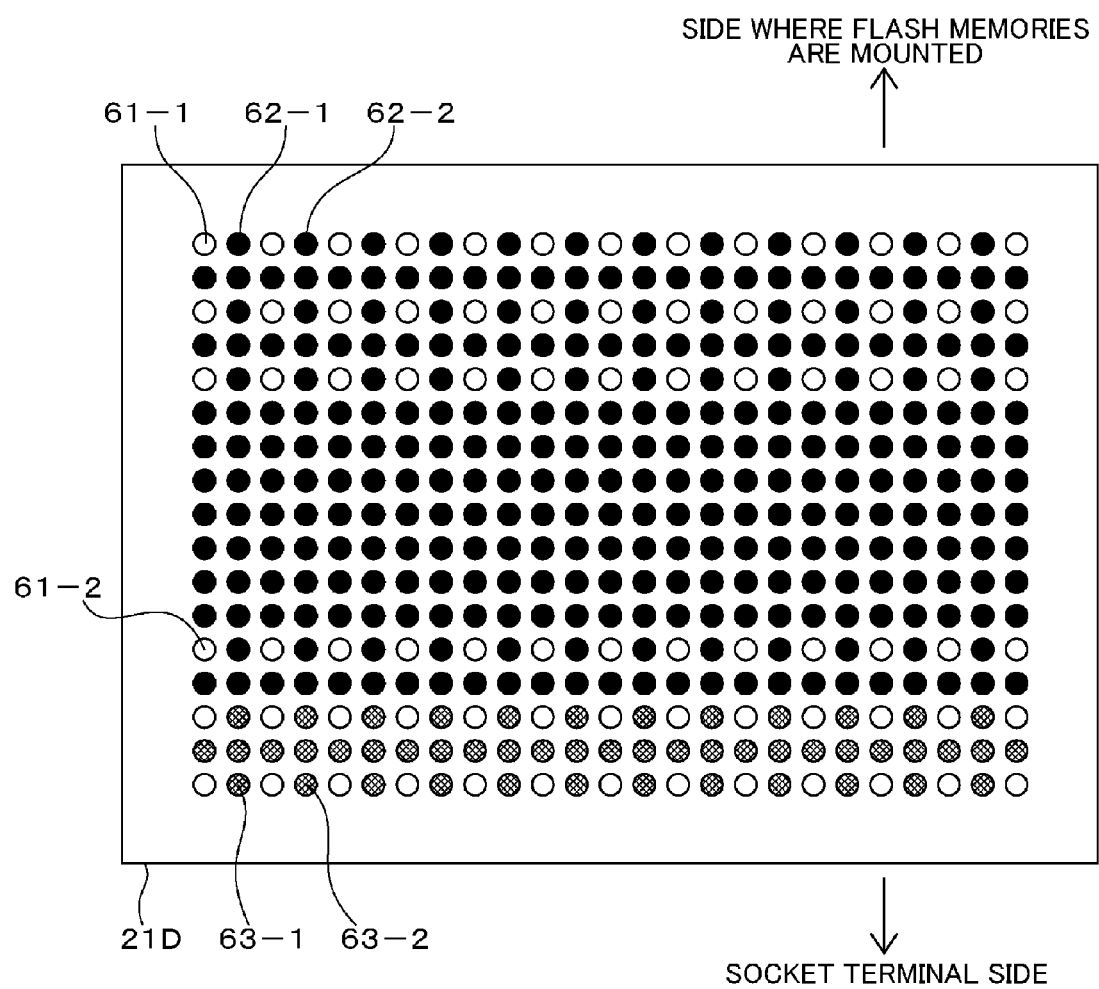
FIG. 7 is a diagram showing the ball arrangement of memory controllers mounted on the hybrid memory module according to the embodiment.

FIG. 7 is a diagram showing the ball arrangement of memory controllers according to the embodiment. What is shown in FIG. 7 is the underside (back surface). As discussed above, the data memory controllers 21D and SDRAMs 22S are mounted on a BGA package. The external terminals (bump terminals) of the BGA package are formed by solder balls (balls). The ball pitch of the data memory controllers 21D is half that of the SDRAMs 22D. In FIG. 7, balls 61-1 and 61-2 indicated by hollow circles (white circles) are arranged in the same positions as the balls of the SDRAMs 22S. Balls 62-1 and 62-2 indicated by solid circles (black circles) are for establishing the connection to the external terminals of the flash memories 23F and are arranged between the white-circle balls. Balls 63-1 and 63-2 indicated by hatched circles (gray circles) are for establishing the connection to the socket terminals 52 and are arranged between the white-circle balls. Some of the balls of the data memory controllers 21D indicated by the white circles are not connected to the balls of the SDRAMs 22S but to the external terminals of the flash memories 23F or to the socket terminals 52. In FIG. 7, the balls connected to the external terminals of the flash memories 23F are shown in the upper part and the balls connected to the socket terminals 52 are indicated in the lower part.

FIG. 8A is a diagram showing the ball arrangement of an SDRAM package. What is shown in FIG. 8A is the upper side (surface). In FIG. 8A, the balls are located at the back of the sheet. The symbols under the balls indicated by broken-line hollow circles denote acronyms (symbols) representing the names of signals input to and output from the terminals of the SDRAMs 22S. There are seventy-eight balls. FIG. 8B is a diagram showing the function etc. assigned to the terminals of the SDRAM. The column indicated as "CONNECTED CNT" shows to which of the address memory controller (MCA) 21A and the data memory controller (MCD) 21D the terminals of the SDRAM 22S are each connected.

In FIG. 8A, six balls are arranged crosswise and thirteen balls are arranged lengthwise. Between three columns of balls to the left and three columns of balls to the right, there is an empty space equivalent to three columns of balls at the ball pitch of the SDRAMs 22S. If there were provided the balls between those of the SDRAM 22S in addition to the three empty columns, there would be arranged a total of four-hundred-and-twenty-five balls in FIG. 7, i.e., seventeen balls lengthwise and twenty-five balls crosswise. Since the SDRAMs 22S have seventy-eight balls, three-hundred-and-forty-seven balls can be assigned to the connection to the external terminals of the flash memories 23F and to the socket terminals 52. However, not all of seventy-eight balls of the SDRAMs 22S need to be connected to the data memory controllers 21D. That means more than three-hundred-and-forty-seven balls can be assigned to the connection to the external terminals of the flash memories 23F and to the socket terminals 52. For example, as shown in FIG. 7, forty-nine balls may be assigned to the socket terminals 52 and two-hundred-and-ninety-eight balls to the external terminals of the flash memories 23F. It should be noted, however, that depending on the number of configured terminals, not all the terminals need to be assigned the balls. For example, terminals need not be arranged approximately at the center of FIG. 7.

When the side carrying the balls of the data memory controllers 21D and the side carrying the balls of the SDRAMs 22S are joined together, the balls on both sides come to the same positions. Some of the balls in the same positions turn out to be the signal terminals to be connected to one another. These balls carry the data signal (DQ[7:0]) and the data control signal (DQS, DQS#[/DQS], DM). When the mounting positions of the data memory controllers 21D and those of the SDRAMs 22S are joined together back to back, they can be connected at short distances.

FIG. 9 is a diagram showing signal transmission paths in the hybrid memory module according to the embodiment. What is shown in FIG. 9 is a side view of the hybrid memory module 13FD. In FIG. 9, two-ended arrows indicate signal paths. A signal path 71 is located between the socket terminals 51 and the data memory controllers 21D. A signal path 72 is located between the data memory controllers 21D and the SDRAMs 22S. The signal paths 71 and 72 extend over short distances.

Also, a signal path 73 is located between the data memory controllers 21D on the one hand and the flash memories 23F on the other hand. Whereas the signal path 73 involves numerous signal lines, that path has a less need for high-speed transmission than the signal paths 71 and 72. Thus these signal lines can be extended to some extent within the substrate 51 made up of as many as ten layers of wiring.

First Variation

FIG. 10 depicts diagrams showing the arrangement of components in a hybrid memory module as a first variation of the embodiment. FIG. 10(a) shows the surface of the memory module and FIG. 10 (b) indicates the back surface of the hybrid memory module. The DIMM 50A as the first variation has the data memory controllers (MCD) 21D and the SDRAMs (DRAM) 22S arranged alternately on the surface and back surface of the substrate 51. The arrangements of the address memory controller (MCA) 21A, flash memories (Flash) 23F, SPD 31, and socket terminals 52 are the same as those of the memory module 50 embodying the invention. Since there exist numerous lines between the data memory controllers (MCD) 21D and the flash memories (Flash) 23F, arranging alternately the controllers and the memories provides more room to install the wires therebetween.

FIG. 10 shows five data memory controllers (MCD) 21D and four SDRAMs (DRAM) 22S arranged on the surface of the substrate. Alternatively, four data memory controllers (MCD) 21D and five SDRAMs (DRAM) 22S may be arranged on the substrate surface.

Second Variation

Figure 11:
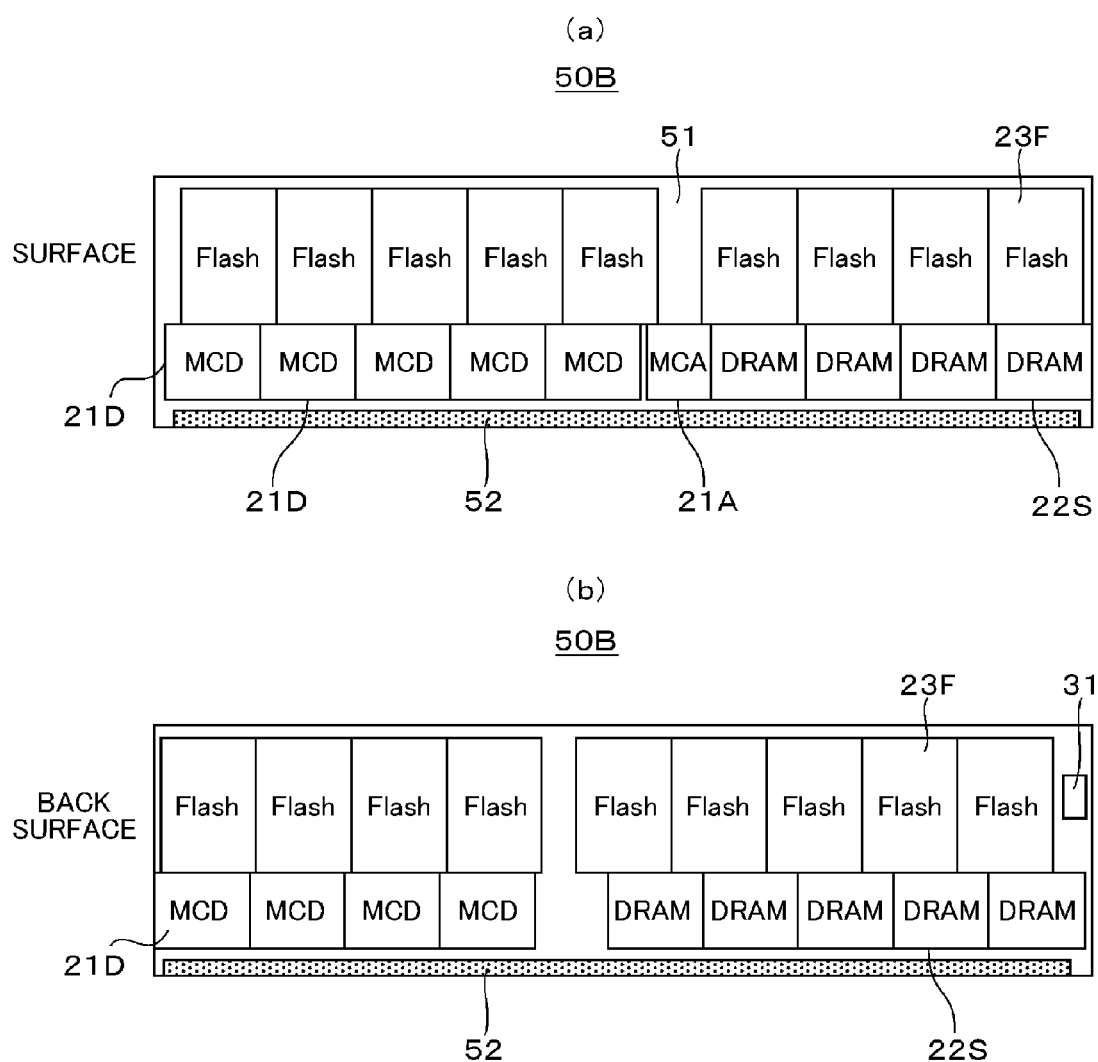
FIG. 11 depicts diagrams showing the arrangement of components in a hybrid memory module as a second variation of the embodiment.

FIG. 11 depicts diagrams showing the arrangement of components in a hybrid memory module as a second variation of the embodiment. FIG. 11(a) shows the surface of the hybrid memory module and FIG. 11 (b) indicates the back surface of the hybrid memory module. The DIMM 50B as the second variation has five data memory controllers (MCD) 21D arranged on the left side of an address memory controller (MCA) 21A and four SDRAMs (DRAM) 22S arranged on the right thereof. An SDRAM (DRAM) 22S is arranged behind each of the five data memory controllers (MCD) 21D, and a data memory controller (MCD) 21D is arranged behind each of the four SDRAMs (DRAM) 22S. The arrangements of the address memory controller (MCA) 21A, flash memories (Flash) 23F, SPD 31, and socket terminals 52 are the same as those of the memory module 50 embodying the invention. Even in a case where the address terminals of the data memory controllers (MCD) 21D are located lopsidedly on the right side or left side, it would be possible to easily wire the data memory controllers (MCD) 21D to the address memory controller 21A without altering the terminal positions of the data memory controllers (MCD) 21D.

In FIG. 11, five data memory controllers (MCD) 21D and four SDRAMs (DRAM) 22S are arranged on the surface of the substrate. Alternatively, four data memory controllers (MCD) 21D and five SDRAMs (DRAM) 22S may be arranged on the substrate surface.

Third Variation

FIG. 12 depicts diagrams showing the arrangement of components in a hybrid memory module as a third variation of the embodiment. FIG. 12(a) shows the surface of the hybrid memory module and FIG. 12 (b) indicates the back surface of the hybrid memory module. The DIMM 50C as the third variation has half as many flash memories 23F (half the flash memory capacity) as the hybrid memory module 50 in the embodiment of the invention. Halving the number of the mounted flash memories increases the number of SDRAMs 22S that can be mounted (SDRAM storage capacity). If only one flash memory 23F is mounted on the back of the substrate 51, the flash memory 23F can be better isolated from the heat from the CPU, which is a source of high heat.

While the present invention devised by the inventors has been described above using specific terms in the form of an embodiment and its variations, it is evident that the invention is not limited to the above-described embodiment or variations and that the invention may be implemented in diverse ways.

REFERENCE SIGNS LIST

60 Memory module
61 Substrate
62 Socket terminal
63 High-speed memory
64 Nonvolatile memory
65 Controller

The invention claimed is:

1. A memory module comprising:
a substrate having a first side and a second side opposing to the first side;
a plurality of external terminals arranged on a surface and a back surface of the substrate on the first side thereof;
a first memory controller;
a high-speed memory; and
a nonvolatile memory;
wherein the first controller and the high-speed memory are arranged opposite to one another across the substrate; and
wherein the nonvolatile memory is arranged closer to the second side than the first memory controller or the high-speed memory.

2. The memory module according to claim 1, wherein the high-speed memory is arranged right behind the first memory controller.

3. The memory module according to claim 2, further comprising:
a plurality of terminals on the back surface of the first memory controller; and
a plurality of terminals on the back surface of the high-speed memory;
wherein each of the terminals come to same corresponding position when the first memory controller and the high-speed memory are joined together back to back; and
wherein some of the terminals in the same corresponding positions are assigned same functions.

4. The memory module according to claim 3, wherein a terminal pitch of the first memory controller is half of the terminal pitch of the high-speed memory.

5. The memory module according to claim 4, wherein each of the plurality of terminals is a ball.

6. The memory module according to claim 5, wherein the non-volatile memories are arranged on both surfaces of the substrate.

7. The memory module according to claim 1,
wherein a plurality of the first memory controller and a plurality of the non-volatile memories are provided; and
wherein the number of the first memory controllers is same as that of the high-speed memories.

8. The memory module according to claim 7,
wherein the number of the high-speed memories and the first memory controllers is nine, respectively.

9. The memory module according to claim 8, further comprising:
a second memory controller,
wherein a first group including five of the first controllers is arranged along the first side,
wherein a second group including four of the first controllers is arranged along the first side; and
wherein the second memory controller is arranged between the first group and the second group in the first.

10. The memory module according to claim 9, wherein the nonvolatile memories are arranged on both surfaces of the substrate.

11. A memory module comprising:
a substrate having a first surface and a second surface opposing to the first surface;
an external connection terminal located at one edge of the substrate and arranged on the first surface and the second surface of the substrate;
a plurality of first memory controllers arranged on the first surface of the substrate;
a plurality of high-speed memories arranged on the second surface of the substrate; and
a plurality of non-volatile memories;
wherein the nonvolatile memories are arranged farther from the terminal than the first memory controllers or the high-speed memories.

12. The memory module according to claim 11, wherein the high-speed memories are arranged right behind the first memory controllers.

13. The memory module according to claim 12, further comprising:
a plurality of terminals on the back surface of the first memory controllers; and
a plurality of terminals on the back surface of the high-speed memories;
wherein each of the terminals come to the same corresponding position when the first memory controllers and the high-speed memories are joined together back to back; and
wherein some of the terminals in the same corresponding positions are assigned the same functions.

14. The memory module according to claim 13, wherein the terminal pitch of the first memory controllers is half of the terminal pitch of the highs-speed memories.

15. The memory module according to claim 14, wherein the nonvolatile memories are arranged on both surfaces of the substrate.

* * * * *